US011830743B2

(12) United States Patent
Aliev et al.

(10) Patent No.: US 11,830,743 B2
(45) Date of Patent: Nov. 28, 2023

(54) SHAPING NANOMATERIALS BY SHORT ELECTRICAL PULSES

(71) Applicant: Board of Regents, The University of Texas System, Austin, TX (US)

(72) Inventors: Ali E. Aliev, Plano, TX (US); Ray H. Baughman, Dallas, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 236 days.

(21) Appl. No.: 17/305,295

(22) Filed: Jul. 2, 2021

(65) Prior Publication Data

US 2022/0005707 A1 Jan. 6, 2022

Related U.S. Application Data

(60) Provisional application No. 63/048,037, filed on Jul. 3, 2020.

(51) Int. Cl.
| | |
|---|---|
| H01L 21/3213 | (2006.01) |
| B81C 99/00 | (2010.01) |
| H10K 71/20 | (2023.01) |
| H01J 19/24 | (2006.01) |

(52) U.S. Cl.
CPC ...... *H01L 21/32136* (2013.01); *B81C 99/001* (2013.01); *H01J 19/24* (2013.01); *H10K 71/233* (2023.02); *B81C 2201/0145* (2013.01)

(58) Field of Classification Search
CPC ............. H01L 21/32136; H01L 21/306; H01L 21/302; B81C 99/001; H01J 19/24; H10K 71/233; H10K 71/211; H10K 85/221
See application file for complete search history.

(56) References Cited

U.S. PATENT DOCUMENTS

| 10,361,083 B2* | 7/2019 | Mazur ............... H01L 21/02532 |
| 2002/0053522 A1* | 5/2002 | Cumings ............... C30B 29/605 |
| | | 205/640 |

(Continued)

FOREIGN PATENT DOCUMENTS

WO    2018022154 A3    3/2018

OTHER PUBLICATIONS

Aliev et al., "Shaping nanomaterials by short electrical pulses," Nanotechnology 31 (2020), 365302, 12 pp.

(Continued)

*Primary Examiner* — Donald L Raleigh
(74) *Attorney, Agent, or Firm* — YEE & ASSOCIATES, P.C.

(57) ABSTRACT

A dry-state non-contact method for patterning of nanostructured conducting materials is disclosed. Short self-generated electron-emission pulses in air at atmospheric pressure can enable an electron-emission-based (field enhancement) interaction between a sharp tungsten tip and elements of the nanostructured materials to cause largely non-oxidative sequential decomposition of the nanostructured elements. Embodiments can employ a substrate/tip gap of 10 to 20 nm, discharge voltages of 25-30 V, and patterning speeds as fast as 10 cm/s to provide precisely patterned nanostructures (<200 nm) that are largely free of foreign contaminants, thermal impact and sub-surface structural changes.

20 Claims, 11 Drawing Sheets

(56) References Cited

U.S. PATENT DOCUMENTS

2010/0068124 A1* 3/2010 Stevens .................. B82Y 15/00
 423/447.2
2011/0121496 A1* 5/2011 Mickelson ................ B82B 3/00
 264/479

OTHER PUBLICATIONS

Aliev, "Electron emission patterning, A new path towards smaller devices?," Physical Sciences, 122, Mar. 19, 2021, 2 pp.
Baughman,"Non-Contact Patterning of Nanomaterials in Air by Low-Voltage Electron-Emission", Advances in Engineering, Apr. 2021, 10 pp.
Dahmardeh et al., "Possible mechanism in dry micro-elecgtro-discharge machining of carbon-nanotube forests: A study of the effect of oxygen," 3. Appl. Phys. 109, 093308 (2011), 5 pp.
Ernst et al., "Optimisation of the preparation process for tips used in scanning tunneling microscopy," Max Planck Institute for Chemical Physics of Solids, Dresden and Department of Physics Faculty of Mathematics and Natural Sciences Technical University Dresden (2006), 95 pp.
Goiogana et al., "Self-Flushing in EDM Drilling of Ti6Al4V Using Rotating Shaped Electrodes", Materials, 2019, 12, 989, doi: 10.3390/ma12060989, 20 pp.
Jahan, et al., "Experimental investigation and characterization of nano-scale dry electro-machining", Journal of Manufacturing Processes (2012), 9 pages.
Khalid, et al., "High-aspect-ration, free-form patterning of carbon nanotube forests using micro-electro-discharge machining", Diamond & Related Materials, (2010), 6 pp.
Khan, et al., "A study of electrode shape configuration on the performance of die sinking EDM", International Journal of Mechanical and Materials Engineering, Jun. 2009, 6 pp.
Kumar, "Can anyone suggest a suitable method for removal of carbon layered deposition over copper tool electrode used in ED process?," rdar Vallabhbhai National Institute of Technology, 9th ed. (Sep. 2015), 5 pp.
Mysinski, "Power supply unit for an electic discharge machine", Conference Paper, Oct. 2008, doi: 10.1109/EPEPEMC.2008. 4635451, Source: IEEE Xplore, 6 pp.
Rajurkar, et al., "Micro and Nano Machining by Electro-Physical and Chemical Processes," Annals of the CIRP, vol. 55/2/2006, doi: 10.1016/j.cirp.2006.10.002, 24 pp.
Roumeli, et al., "Characterization of Vertically Aligned Carbon Nanotube Forests Grown on Stainless Steel Surfaces," Nanomaterial 2019, 9, 444; doi: 10.3390/nano9030444, 14 pp.
Saleh, et al., "Dry micro-electro-discharge machining of carbon-nanotube forests using sulphur-hexafluoride", Carbon 52 (2013) pp. 288-295.
Saleh, et al., "Field-emission-assisted approach to dry micro-electro-discharge machining of carbon-nanotube forests;" Journal of Applied Physicis, Nov. 2011; doi: 10.1063/1.3663438, 9 pp.
Shrestha, Designing an Electrode for Electrical Discharge Machining for Electrical Discharge Machining (EDM), 2014, 50 pp.
Tahmasebipour, et al., "Fabrication of STM Tungsten Nanotip by Electrochemical Etching Method," International Journal of Nanoscience, vol. 8, No. 3 (2009), pp. 305-310.
Understanding the Wire EDM Process Handbook, 13 pp.
Xiao, et al., "Scaling approach toward nano electro-discharge machining: Nanoscale patterning of carbon nanotube forests," Microelectronic Engineering 150 (2016) pp. 64-70.
Zhu et al., "Scanning localized arc discharge lithography for the fabrication of microstructures made of carbon nanotubes", Nantoechnology 18 385304, (2007), 7 pp.

* cited by examiner

SHAPING NANOMATERIALS BY SHORT ELECTRICAL PULSES

CROSS REFERENCES TO RELATED APPLICATIONS

Referring to the application data sheet filed herewith, this application claims a benefit of priority under 35 U.S.C. 119(e) from provisional patent application U.S. Ser. No. 63/048,037, filed Jul. 3, 2020, the entire contents of which are hereby expressly incorporated herein by reference for all purposes.

STATEMENT OF GOVERNMENT INTEREST

This invention was made with government support under grant N00014-17-1-2521 awarded by the Office of Naval Research. The government has certain rights in the invention.

BACKGROUND

1. Field

The present invention relates generally to a method and device for patterning conductive nanostructured materials.

2. Description of the Related Art

To make nanostructured devices and macroscopic materials suitable for applications, sheets and assemblies must be tailored, cut, or patterned to the desired size and shape. Conventional patterning technologies are not applicable to aerogel-type nanostructures, like freestanding carbon nanotube (CNT) sheets and highly aligned CNT forests. CNT sheets drawn from the aligned forest typically have a rectangular shape, which naturally comes from the dry-state method used for CNT sheet fabrication.

The use of a laser beam for patterning freestanding CNT sheets and CNT forests strongly depends on material absorption, and requires a tunable lens system for beam focusing. The wide distribution of optical absorptivity, ranging from single layer CNT aerogel films (~0.1) to bulk CNT forests (~1.0), makes precise laser cutting challenging. A laser beam does not provide capabilities for precise variable-depth profile patterning. Another concern for laser cutting is the width of the removed material (the kerf) and the extent of the heat-affected zone (HAZ). The average kerf width, depending on the laser-beam power (0.02-2 W), ranges from 6 to 50 µm, while the HAZ is less dependent on laser power (20-40 µm). Raman measurements and analysis of mechanical properties (tensile strength, Young modulus) of cut edges show that laser-induced damage spreads deep into laser patterned materials.

Conventional ultraviolet light (UV) and plasma patterning can deteriorate the intrinsic properties of nanostructured materials because of the possible use of a photoresist, plasma ions, or liquids (which cause structural shrinkage/densification of aerogels because of capillary forces). For photolithographic patterning, the photoresist and other processing steps adopted from silicon wafer technology are typically applied, which can contaminate the nanostructure and disrupt nanotube alignment. Modification of the substrate surface for patterned growth of desired molecules, like polymer brushes on photoactive semiconducting ($TiO_2$) layer in photocatalytic lithography or a super aligned CNT forest on a patterned array of catalytic nanoparticles is another promising approach to design a variety of nano- and micro-structures in two dimensions.

Dry plasma etching in a mixture of Ar (He) and $O_2$ is routinely used for layer-by-layer processing of CNT arrays. However, the non-selective nature of plasma treatment limits its application for patterning. The recently developed atmospheric pulsed micro-plasma-jet technique is enabling patterning by using a narrow (~100 µm) scanning plasma jet. However, the low resolution of the patterning, due to the large diameter of the plasma beam, and the very low etching speed (0.5 mm/s) is unlikely to meet the requirements of most commercial applications.

Electrical discharge machining (EDM) was introduced primarily for machining of hard metals. Very recently, it has been used for enhancing the uniformity of field emission from a very entangled, non-uniform CNT forest, and for shaping micro-electro-mechanical systems (MEMS).

Major limitations exist for the above described methods. These limitations for existing dry-state patterning methods for nanostructured materials include structural distortions, contamination, high mechanical or thermal impact area, and resulting low resolution.

Despite the many available theoretical models and commercially available tools, the material removal mechanism for most of these techniques is not yet deeply understood. Moreover, the patterning of microns thick, freestanding aerogel films and very fragile 3D sponge and foam nanostructures is very challenging, and needs more precise and delicate approaches. To facilitate the application of these material for electronic and optical devices, it is essential to develop techniques for shaping freestanding 2D and 3D nanostructures with minimal loss of material, low contamination, and pattern precision on the nanoscale level.

Accordingly, there is a need for improved methods and devices for patterning nanostructures.

BRIEF SUMMARY

The present invention relates to a method and device for patterning nanostructured conducting materials, like freestanding or supported carbon nanotube sheets, yarns, forests and other two- and three-dimensional nanostructured nanomaterials. The method and device comprise a sharp metallic tip interacting with the material being patterned by means of electron field emission. Using the advantages of field enhancement at sharp ends of nanostructured materials, the discharge voltage is reduced to approximately 25-30 V, depending upon the materials density. In this way, the method comprises non-contact decomposition of only those materials neighboring the sharp metallic (e.g., tungsten) tip. This method causes largely non-oxidative sequential decomposition of nanostructure elements neighboring the tungsten tip. The main decomposition mechanism is thermal dissociation facilitated by Joule heating and electrostatic removal of debris. The non-contact-based patterning of nanomaterials can be as fast as approximately 10 cm/s. The resulting precisely (<200 nm approximately) patterned structures are largely free of foreign contaminants, thermal impact, and sub-surface structural changes. The patterning process requires a pulse generator with a tunable output amplitude of approximately 25-50 V ($I_{out}$<20 mA approximately), commercially available tungsten tips, and an inexpensive manual or motorized XYZ translation stage.

In a particular aspect, the present invention relates to a dry-state patterning technique for freestanding or supported nanostructures, such as multi-walled carbon nanotube (MWNT) forests and freestanding sheets of MWNTs, graphene, graphene sponge, and MXene. The patterning method preferably uses a non-contacting sharp W-tip that moves along the surface of the targeted conductive nanostructure. Short electrical pulses, applied between the W-tip and the conducting nanostructure, induce a high-density electron emission current, which resistively decomposes nanoscale elements of the structure. The non-contact decomposition involves thermal dissociation of structural elements that are closest to the tip and migration of solid decomposition products along the electrostatic field. Based on electrostatic field attraction, the electron beam sequentially cuts the closest object and switches to another in a fraction of a nanosecond. The critically important electron-emission used for sharp tip patterning begins at approximately 24-25 V, and is characterized by a drop of the discharge current amplitude to below ~2 mA and the generation of a train of self-terminated ~20 ns pulses. Initially ignited as a cold electron emission, facilitated by strong field localization, the electron current turns into a current avalanche due to resistive heating of the tip and consequent decrease of the effective work function of the CNT. This is not the case for an opposite polarity of electrodes, when the electron emission comes from the tungsten tip: the temperature of tungsten tip with four orders larger heat capacitance is low at used currents and the work function of the tungsten tip is relatively high and stable.

By comparing the I-V characteristics in air, nitrogen, and vacuum, it can be appreciated (for the gases) that field-enhanced electron emission ignites at about 25 V and extends up to about 65 V. The power supply can be configured to provide a constant amplitude voltage between approximately 25 V and approximately 60 V. A bright discharge cloud appears at the W-tip for voltages above approximately 65 V, which is induced by plasma discharge in the gases. Since the resulting ion-impact plasma etching creates large uncontrollable holes, voltages below this plasma-generating limit were used. The existence of a much lower voltage for field-enhanced electron emission than for plasma generation enables the observed remarkable performance of sharp-tip electron emission (STEM) processing. For dense structures, this voltage window is closed, and mostly direct arc-discharge decomposition (involving high voltage breakdown of medium) takes place.

Thermal oxidation in air is not an important process for STEM patterning, since $O_2$ molecules rarely appear in the about 40 nm separation between removed material and the probe tip. The probe and conducting nanostructured material can be immersed in ambient pressure air. Alternatively, the probe and conducting nanostructured material are immersed in at least one gas selected from a noble gas, an $SF_6$ gas, a nitrogen gas, and mixtures thereof.

For clean, precise patterning of these conducting nanostructured materials, a positive polarity for the W-tip is preferred. For low-density, aerogel-type nanostructures there are no substantial limitations in the precision and the cutting speed. Since the width of patterned gap is determined by the sharpness of the W-tip, further improvement of resolution down to ~10 nm is feasible, when the tip size of the patterned material is below ~10 nm. The atomic-force microscope (AFM) with a conductive deep trench probe can be a proper tool for nanoscale patterning of thin films. However, large scale operation in dense MWNT forest requires periodic cleaning of the W-tip, which could be automatically accomplished during cutting. Conversely, a negative W-tip provides fast cutting without the appearance of debris on the tip, but creates debris on cut edges. The trade-off here is that a negative tip causes resistive overheating of cut edges, which enhances the heat-effected zone, and causes pitting of the W-tip.

The proposed electron emission patterning for processing of carbon and other conductive two- and three-dimensional nanostructures in air can be useful for integration of conductive electronic and optical devices into existing silicon planar technologies. Using this technique, multi-electrode sensors, metamaterials, photonic crystals, and various electronic components have been fabricated.

According to an embodiment of the present disclosure, a process of non-contact, dry-state patterning of a conducting nanostructured material, the process comprises: applying a positive voltage signal to a probe tip with respect to the conducting nanostructured material; moving the probe tip with respect to the conducting nanostructured material while maintaining a spatial separation between the probe tip and the conducting nanostructured material; generating electron field emission within the spatial separation with respect to the conducting nanostructured material; and removing material from at least a first portion of the nanostructured material, wherein the positive voltage signal comprises a periodic sequence of electrical pulses comprising substantially rectangular pulses having a pulse width of between approximately 1 μsec and approximately 10 μsec at a frequency of between approximately 1 kHz and approximately 10 kHz.

According to another embodiment of the present disclosure, a machine for non-contact, dry-state patterning of a conducting nanostructured material, the machine comprises: a power supply configured to provide a positive voltage signal with respect to the conducting nanostructured material; and a probe tip coupled to the power supply, the probe tip configured to move with respect to the nanostructured material while maintaining a spatial separation between the probe tip and the conducting nanostructured material, to generate electron field emission within the spatial separation with respect to the conducting nanostructured material, and to remove material from at least a first portion of the conducting nanostructured material, wherein the positive voltage signal comprises a periodic sequence of electrical pulses comprising substantially rectangular pulses having a pulse width of between approximately 1 μsec and approximately 10 μsec at a frequency of between approximately 1 kHz and approximately 10 kHz.

These, and other, embodiments of the present disclosure will be better appreciated and understood when considered in conjunction with the following description and the accompanying drawings. It should be understood, however, that the following description, while indicating various embodiments of the present disclosure and numerous specific details thereof, is given for the purpose of illustration and does not imply limitation. Many substitutions, modifications, additions and/or rearrangements may be made within the scope of embodiments of the present disclosure, and embodiments of the present disclosure include all such substitutions, modifications, additions and/or rearrangements.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 7A shows the current response of a single self-terminated electrical discharge spark. The peak pulse width, at one-half pulse height, is ~20 ns. The bandwidth of the current probe (which is a Hall probe) is 120 MHz, which corresponds to a pulse resolution time of ~8 ns. FIG. 7B is a graph showing that the applied 10 µs pulse voltage (dashed black envelope with amplitude of +30 V) ignites a train of short self-discharge current pulses (blue vertical lines).

DETAILED DESCRIPTION

Embodiments of this disclosure can include a new dry-state technique for non-contact patterning of nanostructured conducting materials, and demonstrate its use for carbon nanotube forests and freestanding sheets of carbon nanotubes, graphene, graphene sponge, and MXene. This method uses self-generated electron-emission pulses (~20 ns) in air. On a substrate-tip separation scale of 10 to 20 nm, the few molecules of gas at atmospheric pressure enables electron-emission-based interaction between a sharp tungsten tip and elements of nanostructured materials. Using the advantages of field enhancement at sharp ends of nanostructured materials, the discharge voltage is reduced to 25-30 V, depending upon the materials density. This method causes largely non-oxidative sequential decomposition of nanostructure elements neighboring the tungsten tip. The main decomposition mechanism is thermal dissociation facilitated by Joule heating and electrostatic removal of debris. The non-contact-based patterning of nanomaterials can be as fast as 10 cm/s. The resulting precisely patterned structures (<200 nm) are largely free of foreign contaminants, thermal impact, and sub-surface structural changes.

Embodiments of this disclosure can include a method and device for the non-contact processing of conductive, nano-structured, low-dimensional materials using field enhanced electron emission and deploy this method for patterning freestanding and supported 2D films, such as highly aligned or randomly deposited CNT sheets, graphene and MXene films, and their composites. More generally, embodiments of this disclosure can comprise nanostructured material including carbon nanotubes, graphene, graphene oxide, a MXene, a chalcogenide, or a combination thereof. After realizing successful patterning of 2D films, this technology is demonstrated for patterning 3D CNT forest and sponge-type nanostructures. Embodiments of this disclosure can include a probe tip translator coupled to the probe tip, the probe tip translator configured to move the probe tip relative to the conductive nanostructured material in at least one dimension.

Figure 1A:
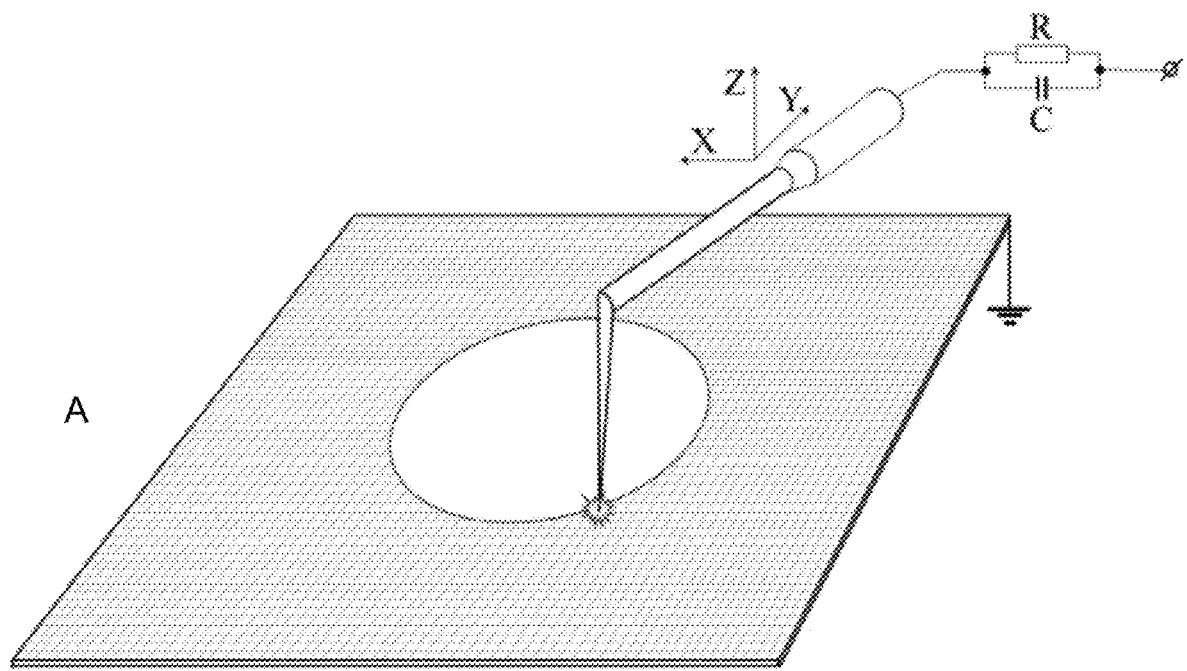
FIG. 1A is a schematic diagram of sharp-tip electron emission (STEM) patterning apparatus showing the electrical connection of the sharp tungsten tip and processed film. The pictured sharp tungsten tip decomposes the individual CNTs in a freestanding sheet when the short pulse current exceeds ~1 mA. The high-pass RC filter, connected in series to the tip, limits the DC current and low frequency signals. (Pictures of the experimental setup can be found in figures S1.1 and S1.2 of the Supplementary Material of U.S. Ser. No. 63/048,037, filed Jul. 3, 2020.) A voltage is applied so that the tip electrode serves as the anode (positive; electron collector), while the CNT sheet (or forest) is the cathode (negative; electron emitter), unless otherwise mentioned. In an embodiment, a tungsten (W) wire with diameter of 0.5 mm, a tip curvature radius of ~0.5 µm, and a 13° taper angle (Electron Microscopy Sciences, Inc.) was used as the tool electrode. For more precise cutting with small kerf, the tungsten tip (W-tip) was sharpened down to a curvature radius of ~80 nm by electrochemical etching in 2M aqueous NaOH solution.
Figure 1B:
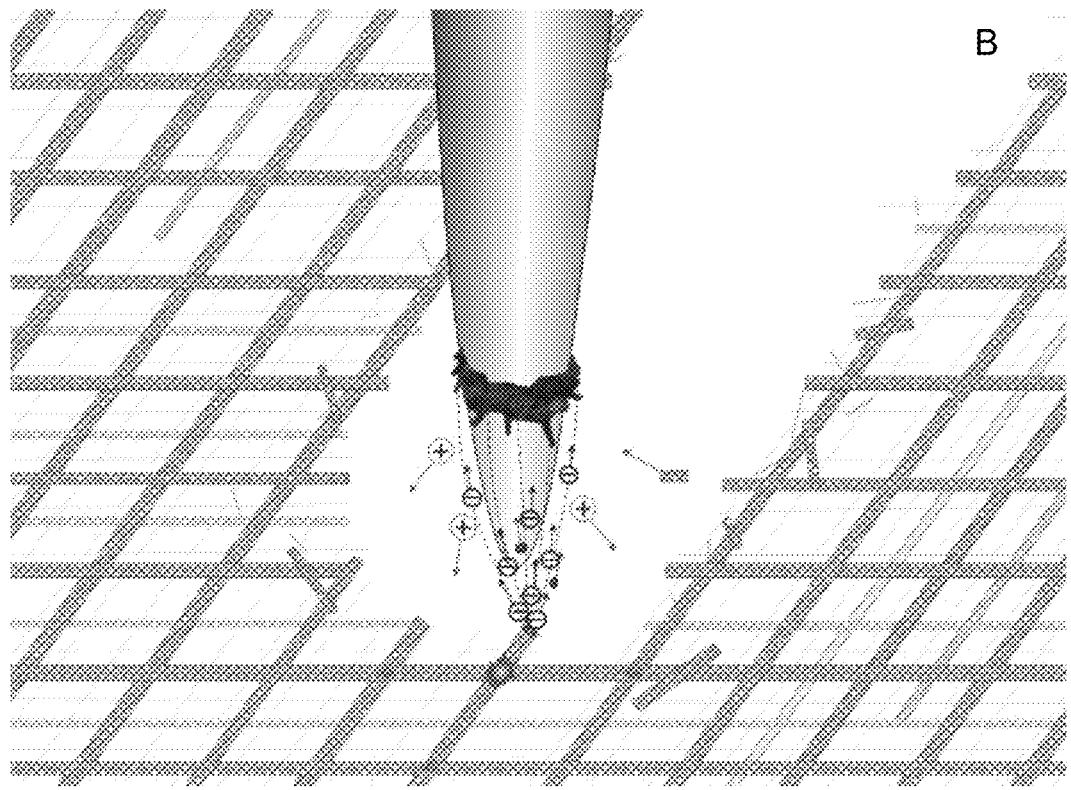
FIG. 1B is a schematic illustration of possible material removal mechanisms including: (1) field-enhanced electron emission currents (small, blue, negatively charged circles moving towards the positive electrode); (2) thermal evaporation at or near CNT ends (due to high field concentration there, and correspondingly high resistive heating); (3) high heating/electromigration at CNT interconnections, where resistance is high (red spots on CNT and brown flying particles); and (4) ion plasma etching at higher voltages (red, positively charged circles).

Actual examples demonstrate this technique for freestanding, highly aligned, carbon multi-walled nanotube (MWNT) films. A MWNT sheet was drawn from a ~200-μm-high, chemical vapor deposition (CVD) grown forest. FIGS. 1A-1B schematically illustrate the sharp-tip electrical discharge (STEM) patterning. As noted above, pictures of the experimental setup can be found in figures S1.1 and S1.2 of the Supplementary Material of U.S. Ser. No. 63/048,037. A voltage is applied so that the tip electrode serves as the anode (positive; electron collector), while the CNT sheet (or forest) is the cathode (negative; electron emitter), unless otherwise mentioned. A tungsten wire with diameter of 0.5 mm, a tip curvature radius of ~0.5 μm, and a 13° taper angle (Electron Microscopy Sciences, Inc.) was used as the tool electrode. For more precise cutting with small kerf, the tungsten tip (W-tip) was sharpened down to a curvature radius of ~80 nm by electrochemical etching in 2M aqueous NaOH solution.

To clean debris from the tip, an additional electrode (not shown in FIGS. 1A-1B) for generating a plasma can be located above the sheet and proximate the tip. Removing debris from the probe tip can include generating a plasma between the probe tip and the counter electrode To attract debris a counter electrode (not shown in FIGS. 1A-1B) can be located below the sheet. Attracting debris from a first portion of the nanostructured material can be implemented by applying an attracting voltage between the probe tip and the additional electrode located opposite the nanostructured material with regard to the probe tip. In a preferred embodiment, the attracting voltage is more positive than a positive voltage signal applied to the probe.

Figure 3A:
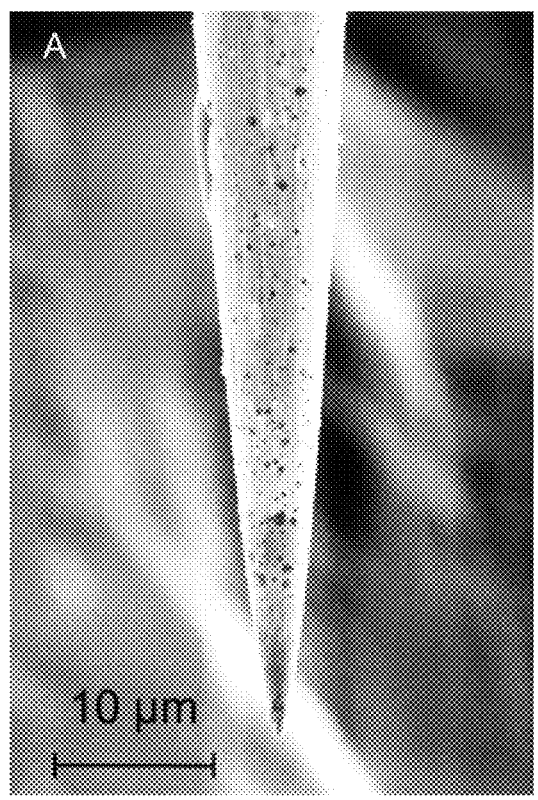
FIG. 3A shows a scanning electron microscope (SEM) image of commercial tungsten tip (W-tip) used for STEM patterning. The curvature radius is ~500 nm.
Figure 3B:
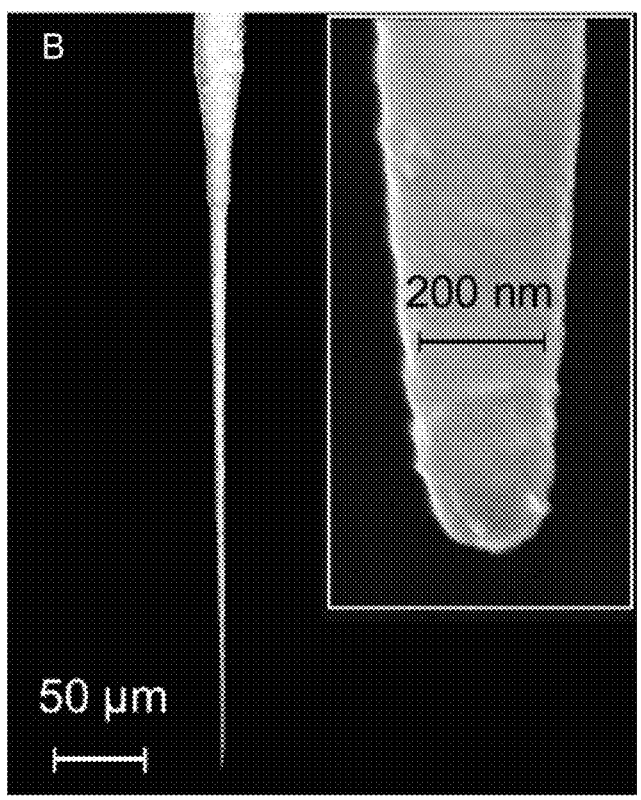
FIG. 3B shows electrochemically sharpened tungsten tip. The inset shows the very tip of the electrode with curvature radius of ~80 nm.
Figure 3C:
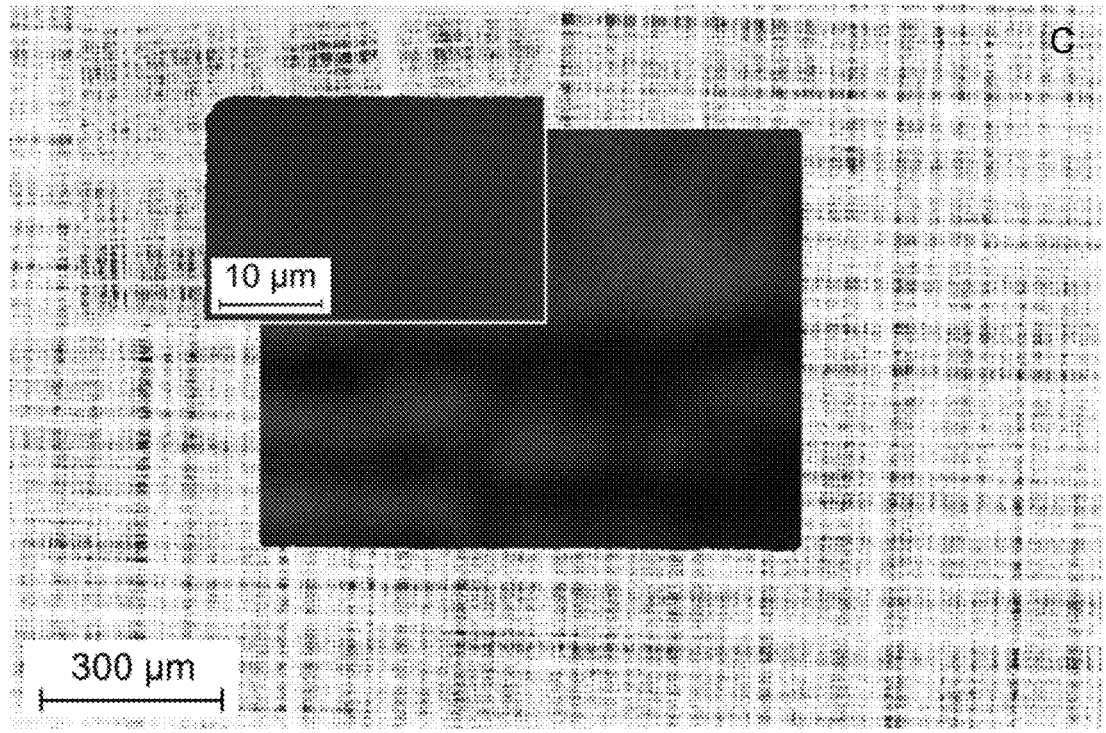
FIG. 3C shows the 700×900 µm² rectangular hole patterned in a freestanding MWNT-4L sheet using the commercial tip. The inset (top-left) shows the magnified view of top-left corner.
Figure 3D:
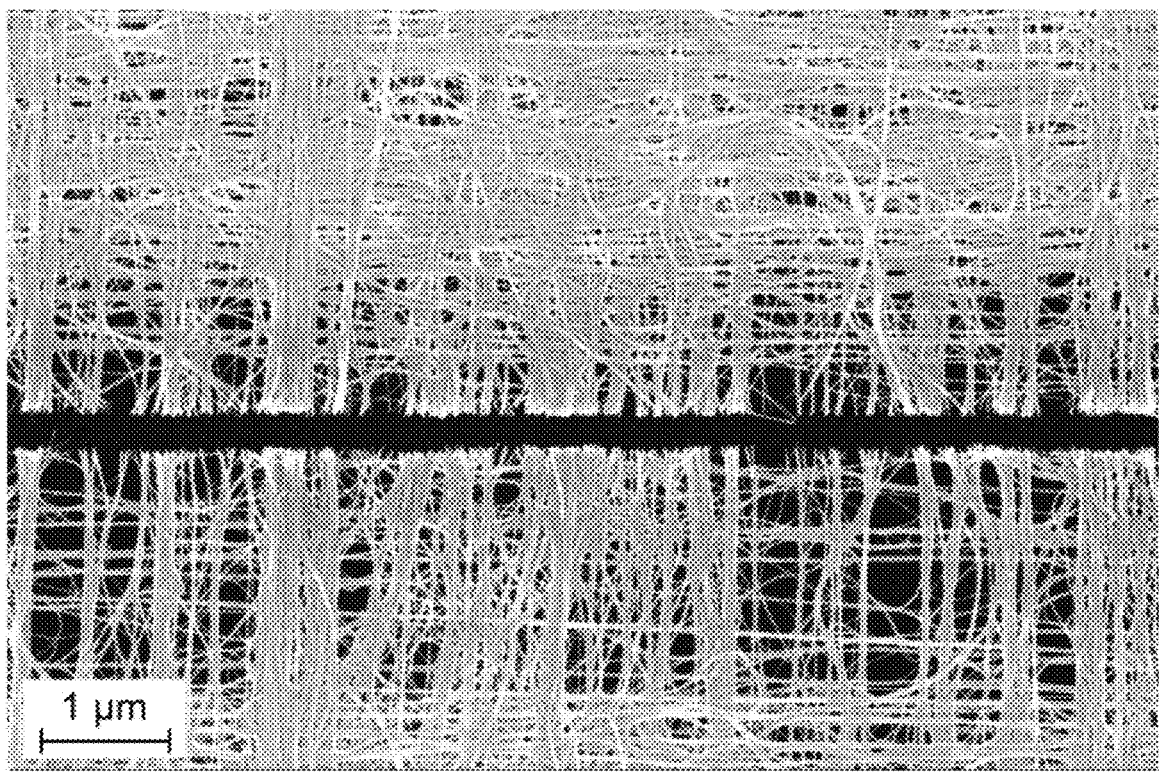
FIGS. 3D-3E show a straight, 240±40 nm wide cut patterned in the same MWNT-4L sheet using the electrochemically sharpened tip at increasing magnification.
Figure 3E:
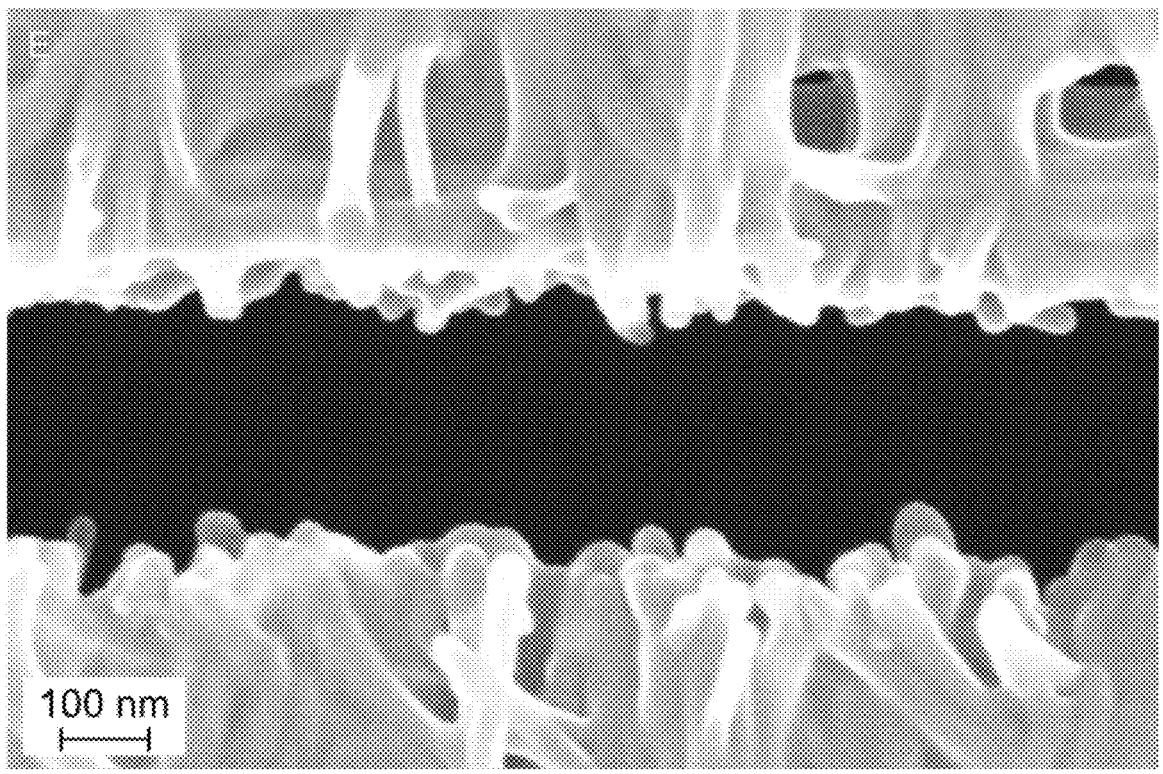

FIGS. 3A and 3B show the tips of commercial and electrochemically etched tungsten electrodes, as discussed further herein. An SEM image of a rectangular hole patterned in an aligned, freestanding stack of four MWNT sheet layers (MWNT-4L) indicates the formation of desired sharp corners in 2D structures, FIG. 3C. Larger structures patterned with complex shapes are shown in section S2 of the Supplementary Material of U.S. Ser. No. 63/048,037. The theoretical gap, g, created by W-tip anode in the 2D sheet was estimated as $g=(2l_{EM}+d_w)$, where $l_{EM}$ is the electron emission processing gap and $d_w$ is the diameter of the W-tip. The measured gap (i.e., the kerf) shown in FIGS. 3D, 3E was over two orders of magnitude thinner than reported for a CNT forest using EDM in air or using EDM in $SF_6$, as well as much thinner than the gap reported for laser patterning. The present minimum g was determined by the diameter of the electrode, its vibrations during high speed movement, and the inhomogeneity of the nanostructure. The kerf shown in FIGS. 3D, 3E was determined by the diameter of the W-tip at the insertion level of the probe into the suspended MWNT-4L sheet, which did not exceed 160-180 nm for the sharpened tip (see insert to FIG. 3B). For the thinnest kerf (200±40 nm), the observed spark gap, $l_{EM}$, was in the range of 30±10 nm. Details of patterning in different thicknesses MWNT sheets and in a non-oriented freestanding single-walled carbon nanotube mat are shown in figures S3.1-3.4 of the Supplementary Material of U.S. Ser. No. 63/048,037.

For macroscopic materials, electrical discharge in gases mostly depends on gas properties and is less dependent on electrode material. The breakdown voltage, $V_b$, in gases is approximated by Paschen's law (i.e., $V_b$ decreases almost linearly with decreasing gap d when d is large): $V_b=Mpd/\ln(Npd/\ln(1+\gamma^{-1}))$, where d is the gap length, p is the pressure of gas, γ is the heat capacity ratio, and M and N are constants that depend on the gas used. For standard atmospheric pressure, this law predicts a minimum breakdown voltage of 327 V at a distance of 7.5 μm. Since impact ionization requires space for electron acceleration, further decrease of distance increases the breakdown voltage. However, at shorter distances the field emission from the cathode surface becomes important.

Due to nanoscale diameters and low densities of CNTs, electron emission from the CNT tips is enhanced by strong field localization. For the geometry of electrodes illustrated in FIGS. 1A-1B, when the electrical field is applied from the end of the tungsten tip to the closest CNT, the effect of electrostatic screening is minimized. The local electric field, $E_{loc}=\beta(V/d)$, can be enhanced more than ~5000 times for low density CNTs. The high field enhancement factor, $\beta=-B\varphi_b d/S$ is usually found from the Fowler-Nordheim (FN) plot, where $B=6.38\times10^9 V\cdot eV^{-3/2}$ m$^{-1}$, $\varphi_b$ is the work function (for metallic CNTs, $\varphi_b$=4.5-5 eV), d is the inter-electrode distance, and S is the slope of the FN plot. The conducting nanostructured material can have a low-density structure that provides a field enhancement factor for electron emission of above 100. In addition to the nanoscale diameter of CNT tips and low work function, strong C—C bonding and chemical stability make them a nearly perfect electron emitter. Nevertheless, at high current density the resistively overheated CNTs eventually degrade.

There are several mechanisms of CNT degradation in gases. In the presence of oxygen, the CNT is readily oxidized at T>500° C. (with an oxidation rate dependent on CNT structural perfection, the number of CNT walls, and the presence of metal catalyst nanoparticles). A remarkably regular staircase of current breakdown with series steps of about 12 μA has been observed in single MWNT resistively heated in air, where the failure of an 8-nm-diameter MWNT required a >200 μA DC current applied for a few seconds. For currents through a single MWNT exceeding ~1 mA, the temperature at a CNT cap rises above the sublimation point (~3642° C.) in a few nanoseconds. It was proposed that the degradation of CNTs in an electron-emitter configuration (with CNT as cathode) arises from the combination of ion bombardment and plasma etching. Other studies of CNTs in an oxygen environment suggest that nanotubes are consumed first at the hemispherical cap at their ends. Degradation because of gas ionization was observed for various gases: $H_2$, He, $N_2$, Air, $O_2$, Ar, $NH_3$, and $SF_6$. Due to high energy and velocity, emitted electrons can strip electrons from gas molecules, leading to a positively charged ionized gas: $e+N_2 \rightarrow N_2^+ +2e$; $e+O_2 \rightarrow O_2^+ +2e$. The probability of negative ion formation is much lower. The breakdown voltage in different gases depends on the ionization potential and the electron mean free path (which is higher for lower pressures and smaller ion diameters). For example, the breakdown voltage in $N_2$ and Ar is much lower than in air. Degradation of CNTs can also result from knock-on damage from the incident electron beam. However, the threshold voltage to create knock-on damage by an incident electron beam (~86 kV) is too high for our experimental conditions.

The experimental results for multilayered MWNT sheets shows that the highest performance STEM patterning was obtained using pulsed excitation, rather a DC voltage. The optimal pulse width was in the range of between approximately 1 μsec and approximately 10 μsec, with a pulse repetition frequency of between approximately 1 kHz and approximately 10 kHz (duty cycle of 1%), and a pulse amplitude of between 25 V and 60 V. The cutting speed was as high as allowed by the XY translation stage, 1 cm/s (10 cm/s by using automated plotter). The periodic sequence of electrical pulses can include substantially rectangular pulses. The pulse width can be between approximately 0.1 μsec and approximately 100 μsec at a frequency of between approximately 0.1 kHz and approximately 100 kHz. The rectangular pulses can have a maximum amplitude of between approximately 25 V and approximately 60 V. In preferred embodiments, the periodic sequence of electrical pulses includes a time interval between pulses configured to prevent damage to a second portion of the nanostructured material adjacent to the first portion of the nanostructured material.

High fidelity patterning, as well as the patterning that produces the lowest damage to neighboring areas, was realized by conducting electron-beam patterning using currents that are limited for one or more of the following reasons or combination thereof: (1) the patterned nanoscale elements are approached individually by the positive probe electrode, and after this element is consumed the field emmision current abruptly decreases until the next nanoscale element is approached (so the current is self-limiting), (2) an electonic elements (like the RC circuit of FIG. 1A) is used to limit the current of a DC power source, or (3) the DC power source is replaced with a power source that provides pulses with a voltage pulse width of between 1 and 10-μs at a frequency of between 1 and 10 kHz. Since the various sample morphologies cannot reliably self-limit the current, the use of the voltage pulse method of (3) is preferred because of its convenient tunability to meet the needs for patterning in a wide range of samples.

Figure 4A:
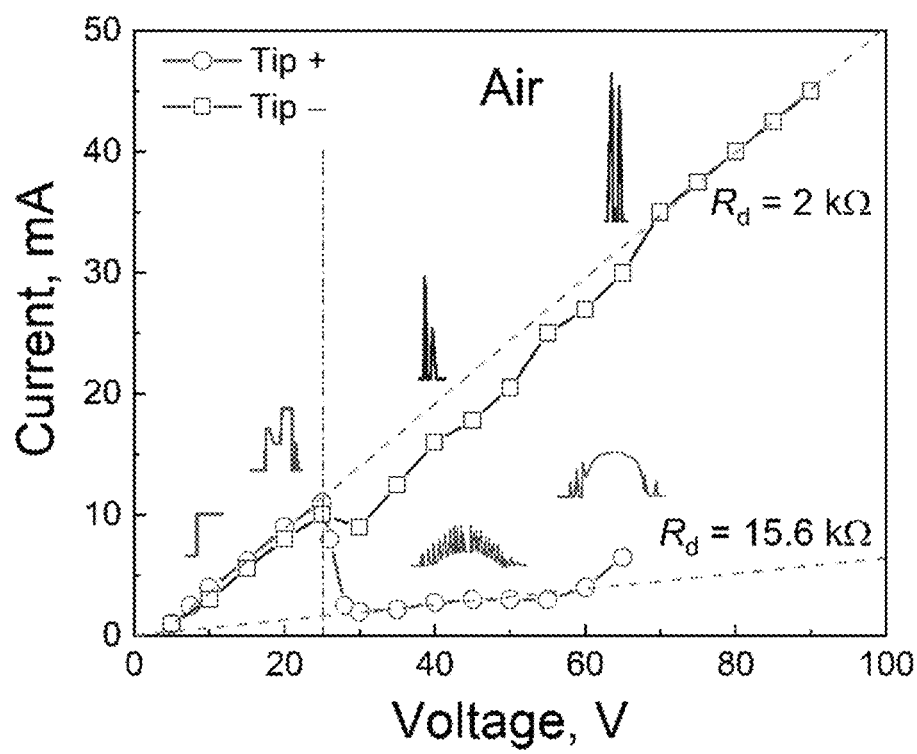
FIG. 4A shows the currect-voltage plot measured in air for STEM patterning of MWNT-4L sheets using a positive (open red circles) and negative (open blue squares) polarity W-tip. The green dashed line is a linear extrapolation of the current response at low voltages, $R_d = U_{app}/I_p$, where $U_{app}$ is the applied DC voltage and $I_p$ is the peak current. The pink dashed line shows the linear extrapolation for short pulses induced by electron emission. The insets above each curve show the shape of current response: green step-like and wide interrupting DC response at low voltages, <25 V; blue, linearly increasing high-amplitude pulses above 25 V for a negative tip; and red short pulse train for a positive tip above 25 V, and red dome-like pulse for $U_{app} > 65$ V.

To understand the electron emission patterning process, the amplitude of current pulses was measured in air, nitrogen, and vacuum. The following initial experiments were actually conducted in air. A DC voltage was applied through a 1 kΩ resistance, which was parallel to a 1 nF capacitor, as shown in FIG. 1A. A freestanding MWNT sheet was attached to a conductive frame (a 2.5×2.5 cm² single-sided copper circuit board with 4×4 cm² hole), densified using methanol, and dried at 65° C. for 10 minutes. FIG. 4A shows the average amplitude of spark pulses for positive (open red circles) and negative (open blue squares) polarities of the tungsten probe. At low voltages (<10 V), direct contact of the tungsten tip to the CNTs results in resistive heating without producing physical damage to the CNTs. Hence, no patterning was observed at these voltages. At 10-25 V, a step-like current alternates with random short pulses, which likely results from resisitive heating of the CNTs until they are ruptured. At these low voltages, the current amplitude linearly increases with applied voltage. Large, bright sparks and red-orange overheated bundles were visible when the tip moved across the sheet. The patterning was not smooth: large bundles need more time to decompose. As a result, the moving tungsten tip drags the MWNT sheet and partially destroys patterning.

At voltages above ~25 V, the current amplitude abruptly decreases to ~2 mA. The 2-5 μs wide and 10-12 mA amplitude pulses observed at $U_{DC}$<25 V transform into 10-20 ns long, ~2 mA amplitude, high-density pulse trains. Further increasing the applied voltage to between 30 and 60 V slightly increased the current background of those pulse trains. The radially emitted long sparks, which were visible under an optical microscope for lower voltages, change to an almost invisible, small halo on the front of the tip for voltages above ~25 V. The patterning in this regime provided sharper walls and less debris than for lower voltages. Further increase in the applied voltage (to above 65 V) creates an uncontrollable random plasma around the tip. For these high voltages, the amplitude of current pulses increase exponentially and the width of current pulses exceeds 1 ms, rather than sharp like for lower voltages (see red inset at the bottom of FIG. 4A). The spark gap (between the probe and CNTs) becomes much larger than the diameter of the tip, and the edge of the cut becomes rough (figure S4 in the Supplementary Material of U.S. Ser. No. 63/048,037). The details of current response, recorded using a TCP0030A Hall-probe acquisition system (Tektronix Inc.), are shown in S5.

Figure 4B:
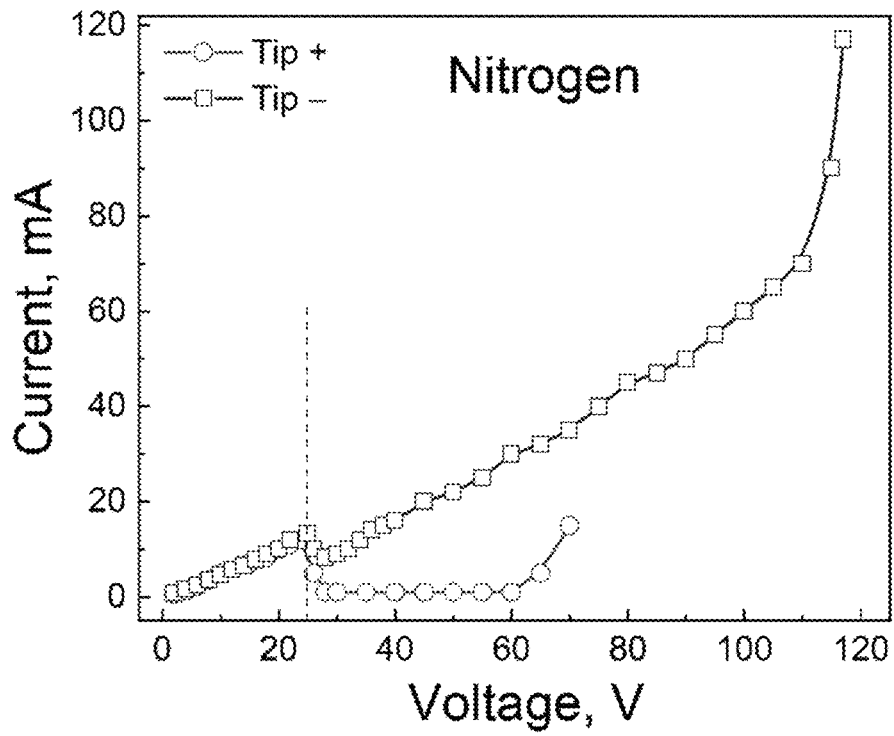
FIG. 4B shows the currect-voltage plot of STEM patterning for the same sample in nitrogen gas. The symbols designation are the same as in FIG. 4A.
Figure 4C:
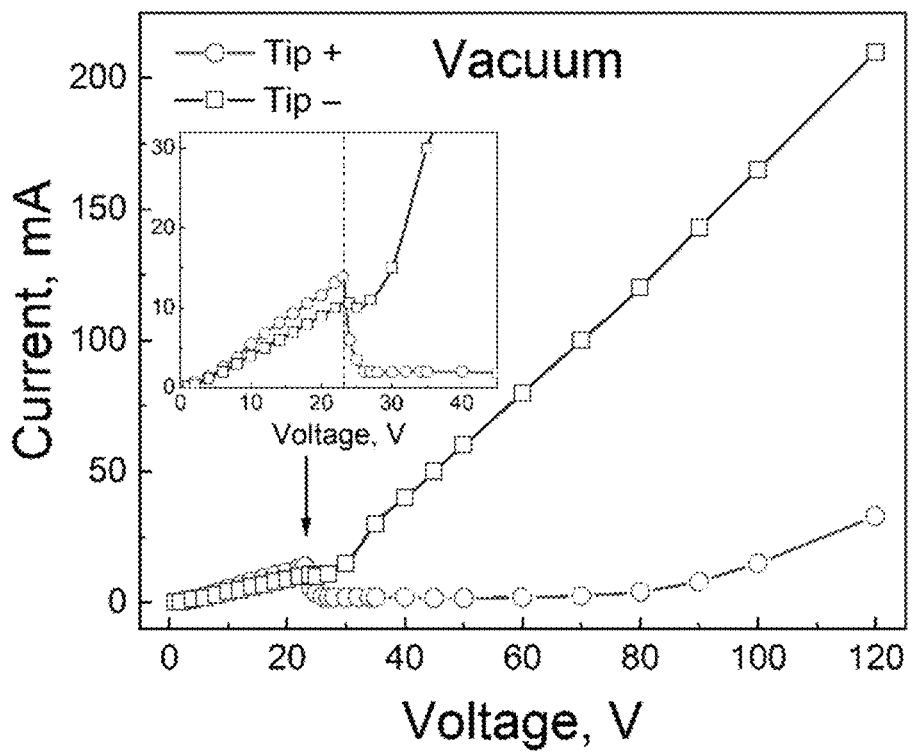
FIG. 4C shows the currect-voltage plot of STEM patterning for the same sample in 0.1 mTorr vacuum. The symbols designation are the same as in FIG. 4A. The inset shows the magnified view of the transition point.

For voltages below ~25 V, the I-V slope is largely independent of the polarity of the tungsten tip, whether the tip is in air, nitrogen, or vacuum (FIGS. 4A-4C). For negative tip polarity in air or in $N_2$, a small decrease of current amplitude occurs above 25 V, but the slope of the curent returns to roughly 2 kΩ for higher voltages. A plasma-like cloud for negative tip appears at voltages above ~110 V for measurements in both air and $N_2$.

For nitrogen atmosphere and a positive tip above the transition point at ~25 V (FIG. 4B), the behavior of spark pulses is roughly the same as in air, except for a halved current amplitude (~1 mA). The same plasma-like halo appears for both air and $N_2$ at voltages>65 V and above >110 V for positive and negative tip polarities, respectively. Surprisingly, in vacuum for a positive tungsten tip, the behavior of spark pulses is close to that in air and $N_2$ (FIG. 4C). The differences for gas and vacuum environments for a negative tip voltage are in the slopes of I-V curves above 25 V. A plasma-like halo does not appear in vacuum, since there are no ions for impact ionization.

Figure 2A:
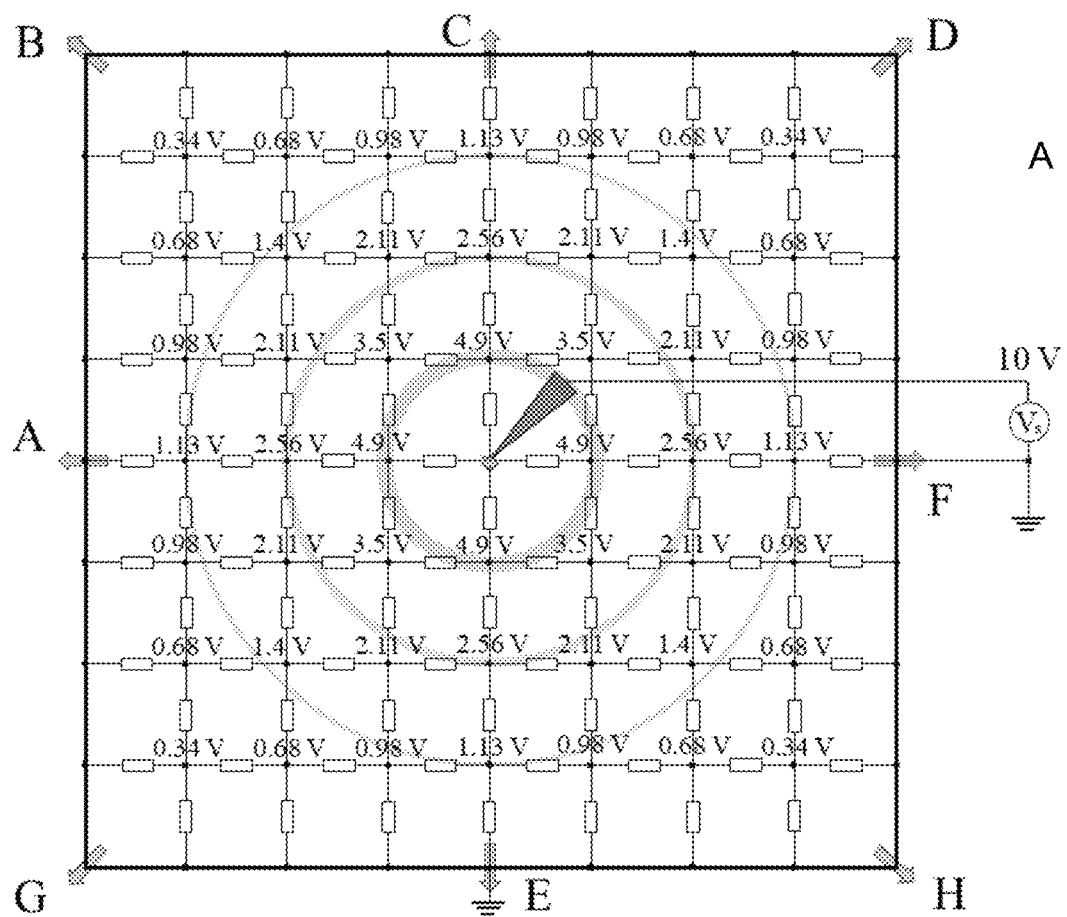
FIG. 2A shows an equivalent circuit simulation of the voltage drop across a rectangular network of conductive MWNTs (R=1 kΩ/sq.). The voltage probe (red wedge tip) applies 10 V DC to the central point of the figure. The light red circles show equipotential profile of the rectangular network.
Figure 2B:
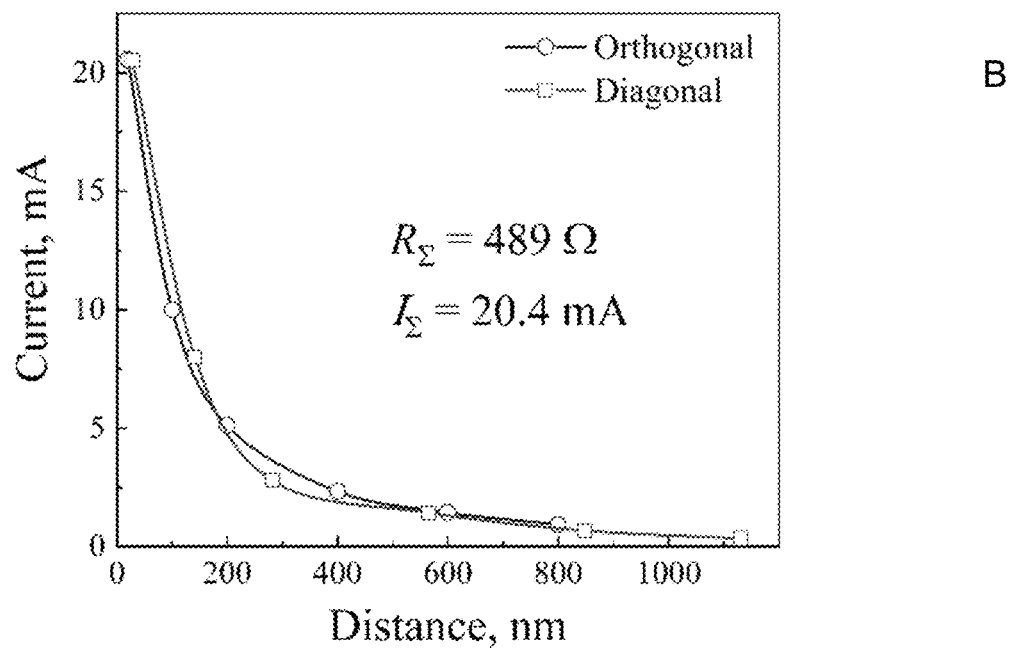
FIG. 2B is a graph of the current decay as a function of distance from the probe along orthogonal (ACFE) and diagonal (BDHG) directions in circuitry of FIG. 2A. The voltage (and thereby the current) decreases one order of magnitude at a distance of 1 µm, and this drop occurs essentially isotropically within the plane.

At voltages below 25 V, the above features imply that a simple resistive decomposition mechanism of patterning occurs in air, other gases, and in vacuum. When the sharp W-tip approaches the conductive aerogel, direct contact results in resistive heating and partial fragmentation of individual CNTs. Large aggregates, like CNT bundles, having much higher heat capacitance and thermal conductance, survive at these low voltages. The current amplitude for this voltage region is determined by the 1 kΩ resistor that is series-connected to the W-tip and the resistances within the MWNT sheet. At positive tip voltages between 24 V and 26 V, the electrostatic field strength (enhanced by strong field localization) becomes sufficiently high to overcome the work function of the CNTs, and induce intense cold electron emission towards the tungsten tip. This electron emission, which occurs by quantum tunneling, requires a high vacuum. Effective electron emission in air is impossible, except at short distances below the elastic mean free path of electrons in air (<200 nm), where the number of air molecules in the nanotube-tungsten tip cone reduces to a few molecules. The reason is that the density of air molecules at ambient pressure and temperature is ~2.55×10$^{25}$ m$^{-3}$, which is a single molecule per ~40 nm$^3$. The strong emission current induces Joule heating of the CNT fiber or bundle that is closest to the tungsten tip. The temperature of the CNTs rises to several thousand Kelvin in ~10-20 ns, until the CNTs decompose. The immediate removal of segments of proximate CNTs, and heat dissipation along the sheet, prevents further expansion of the spark current. In a few nanoseconds (see FIG. 7B), the electrical field switches to the next closest sharp object. The short interaction times (10-20 ns) and rapid heat dissipation in the CNT network prevent development of large current amplitudes. On the other hand, heating is localized by current distribution from the point tip to the 2D network of the MWNT sheet. The equivalent circuit simulation in FIGS. 2A, 2B shows a ten-fold smaller DC current flow (a hundred-fold lower electrical power and corresponding temperature) through the network elements at a distance of 1 μm.

Figure 4D:
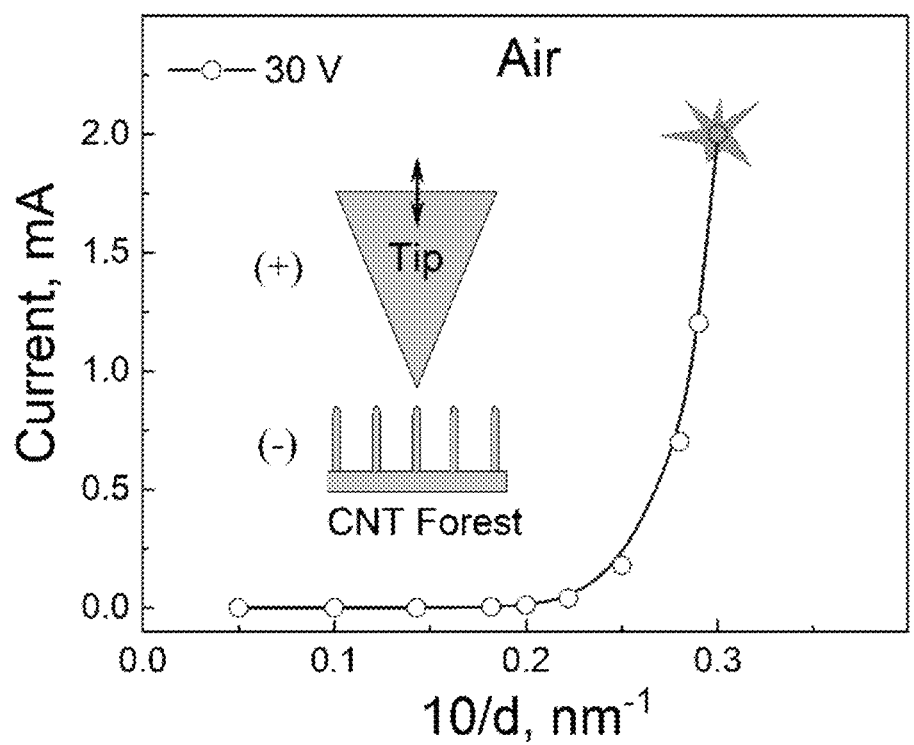
FIG. 4D shows the development of electron emission current from the W-tip (+) as this tip approaches the vertically aligned MWNT forest (-) in air at an applied voltage of 30 V. The inset illustrates the apparatus setup.

FIG. 4D shows that the observed current is indeed an electron emission current, which starts to rise exponentially below 50 nm distance between the W-tip and the vertically aligned MWNT forest, until it decomposes the closest end of a nanotube (or nanotube bundle) at a distance below ~30 nm (shown by red explosion symbol). The current data points (collected using a high sensitivity multimeter, Keithley 2010, for DC voltage and by a Stanford Research Systems SRS-830 lock-in amplifier for AC voltage) were averaged for 10 consecutive measurements. For each measurement, the W-tip was moved to the surface of MWNT forest until a contact point (zero point), which was measured by the multimeter. Then, the tip was moved back 200 nm, a DC voltage of 30 V was applied, and then the tip was moved towards the forest surface (using a 10 nm resolution piezo-actuated positioner NF5DP20 driven by a TPZ001 electronic driver from ThorLab Inc.). The root-mean-square average value of the observed decomposition current ($I_{rms}$~1 mA) is consistent with the electrical breakdown current reported for a single MWNT in air (~0.2 mA). The electron emission current developing at a large distance (70 nm to 40 nm) ignites as a cold emission with work function close to that reported in literature (~0.45 eV). Remarkably, the current slope at I>0.2 mA rapidly increases due to the rising temperature of emitting MWNT tips and consequent decrease of the effective work function, $\varphi_e(T)=\varphi_0-\gamma((k_bT)^2/\varphi_0)$, where γ varies with the structure.

No electron emission is developed for the opposite polarity of the tungsten electrode, (−). Hence, the I-V curve for the negative tungsten tip shows a gradual increase of current with increasing voltage. The small bump at 25 V observed for the negative tungsten tip for all three plots (FIGS. 4A-C) is apparently caused by CNT fragments that adhere to the tungsten tip. Thorough cleaning (mechanical polishing) of the tip confirms the origin of this bump.

The reduced heat dissipation in vacuum increases the local temperature of the MWNT sheet. The abrupt decrease of discharge current amplitude occurs at slightly lower voltages in vacuum (21-22 V) than in air (~25 V). The current amplitude for a negative polarity of the tungsten tip increases two-fold, due to the negative temperature coefficient of resistance (TCR) of a MWNT sheet. The absence of gas molecules in vacuum eliminates the development of impact ionization and a plasma. Thus, the slope of current increase is constant up to the highest applied voltage (~150 V).

The similarity of MWNT sheet patterning in air, nitrogen and vacuum indicates a mechanism of carbon decomposition other than thermal oxidation. Apparently, the high current density in CNTs, resulting from field-enhanced electron emission, induces Joule heating, which reduces the work function and leads to a current avalanche that decomposes the interacted area. The most overheated areas are for CNTs tips closest to the tungsten electrode, and for nearby inter-nanotube junctions in the CNT network (red spots in FIG. 1B). The strong electrostatic field, enhanced several thousand times at proximate CNTs, removes CNT segments and transports them to lower voltage surfaces (especially the tungsten tip). Short CNT segments (30-100 nm long) were observed on the exposed side of the W-tip and near the edges of cuts. FIGS. S3.1, S3.2 of the Supplementary Material of U.S. Ser. No. 63/048,037 show short CNT-segment debris on the edges of a 3.6 μm and 3.0 μm cuts for MWNT-8L and MWNT-4L, respectively. The decomposition of CNTs for a negative tip is quite different: no appreciable electron emission is formed from the cold tungsten tip having a high work function (4.5-5.2 eV). The electro-discharge arcs formed by direct contact of W-tip with CNTs (similar to EDM processing) decompose the CNTs to the carbonaceous spheres observed around the cut. Despite the roughness of the negative polarity cut and the wider heat impact zone, the cut edges of the CNT sheet are much cleaner than for a positive polarity cut (see figure S3.5 of the Supplementary Material of U.S. Ser. No. 63/048,037).

The most pronounced advantages of dry-state STEM patterning were demonstrated for 3-D nanostructures, such as MWNT forest and graphene sponge (GS). The MWNT forest, grown by CVD catalyst methods on a silicon wafer, are usually attached to the Si substrate through a 50-100 nm thick $SiO_2$ insulating layer. There are two options for electrically connecting the MWNT forest to the cathode wire. This wire can be connected to the bottom of the silicon substrate, including the edges of the wafer, or directly to the top of the conducting MWNT forest at several peripheral points. The former connection is capacitive and the latter is ohmic (see details in section S8 of the Supplementary Material of U.S. Ser. No. 63/048,037). The optimal voltage for smooth patterning of a ~200 μm tall forest with capacitive connection is 50-55 V, whereas for ohmic connection, the optimal voltage is the same as for a freestanding MWNT sheet ($U_{opt}$=30-35 V). At 65 V and above, the short sparks convert to large plasma-discharge arcs, which generate rough cut edges.

Figure 5A:
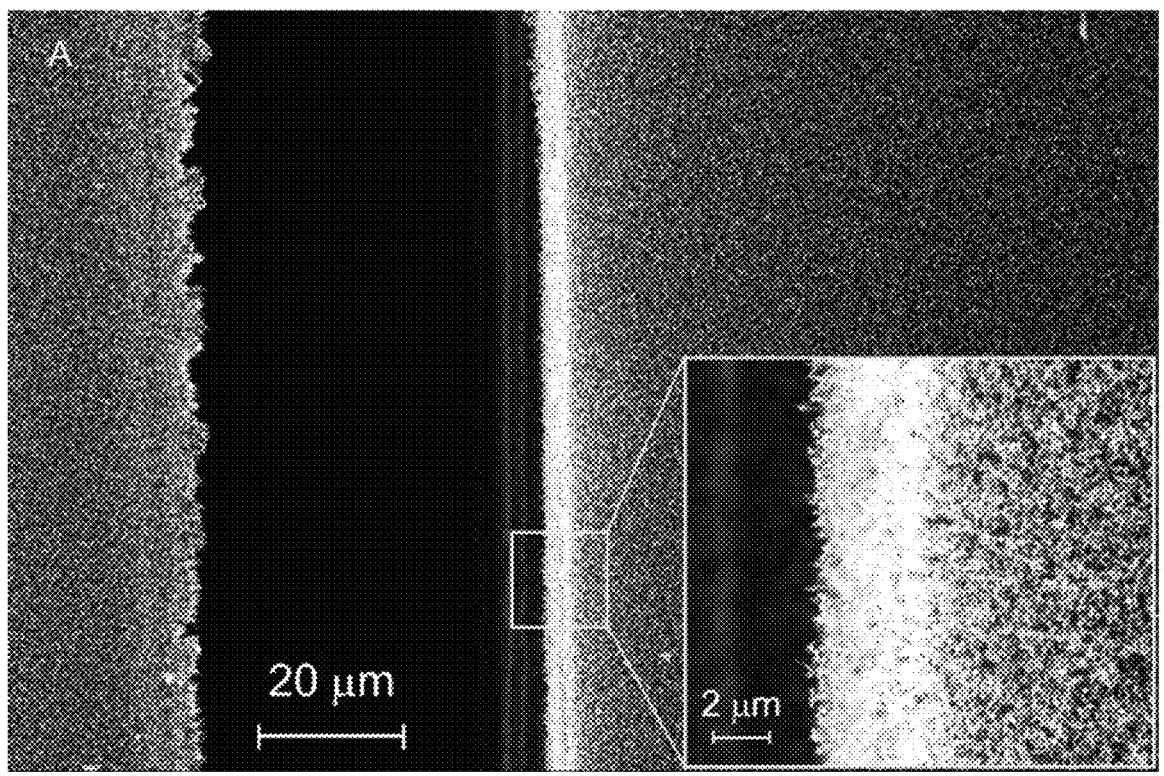
FIG. 5A shows a STEM patterned trench in a 200-µm-high MWNT forest that was formed by using the commercial W-tip (+55 V). The inset shows that the intrinsic structure of the MWNT forest was not substantially modified on the sidewalls of the trench.
Figure 5B:
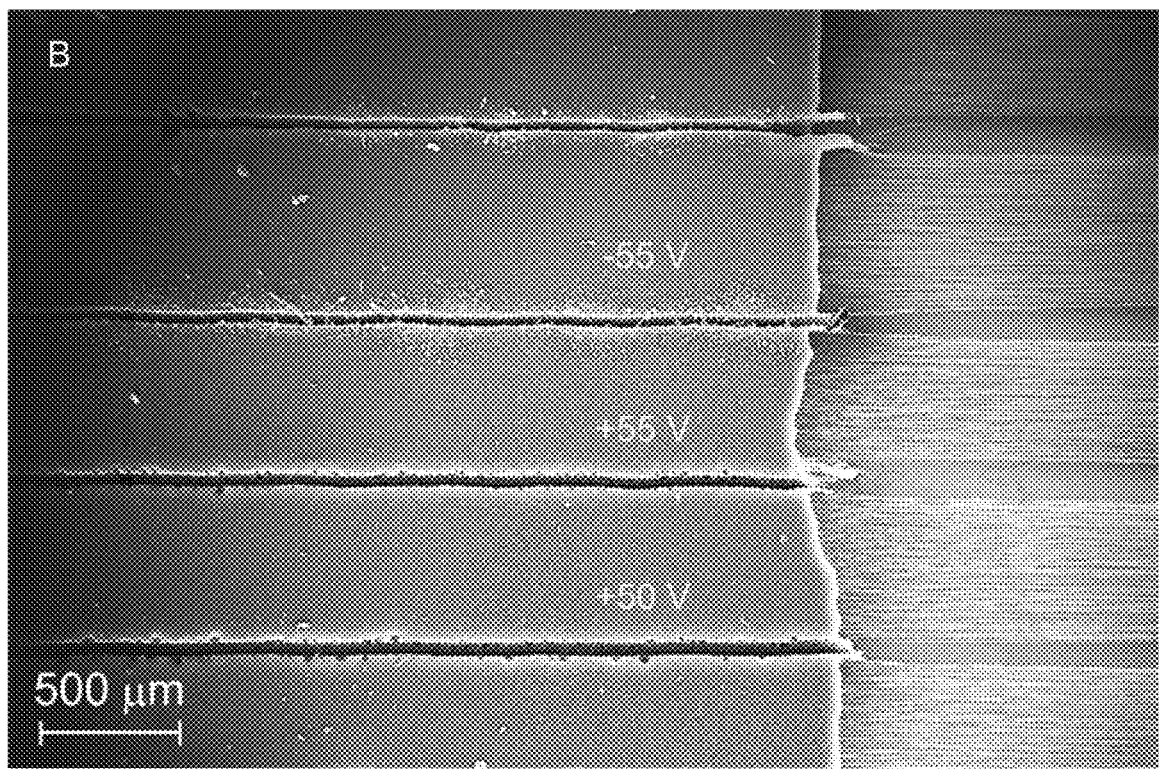
FIG. 5B shows an SEM image of a series of 0.5-mm-wide cut strips in the MWNT forest, from which constant width, super-aligned, freestanding CNT sheets have been drawn (shown on the right).
Figure 6A:
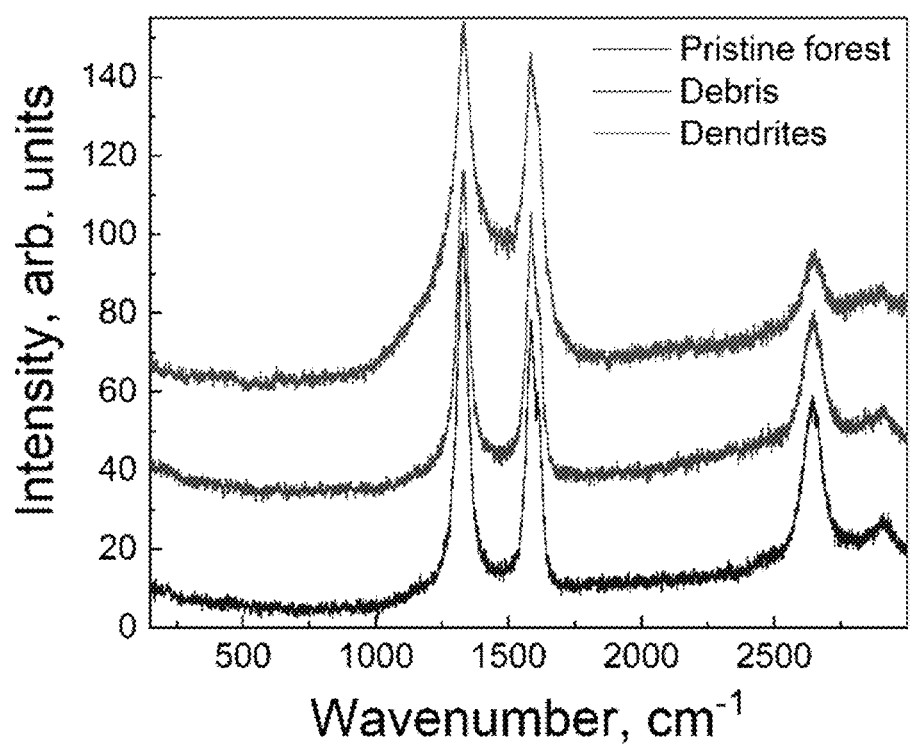
FIG. 6A is a graph showing the Raman spectra of pristine MWNT forest (blue line on the bottom), debris at the forest edges (red line on the middle), and dendrites for a positive polarity of the tungsten tip that are generated when an applied voltage of 45 V (green line on the top) was used.
Figure 6B:
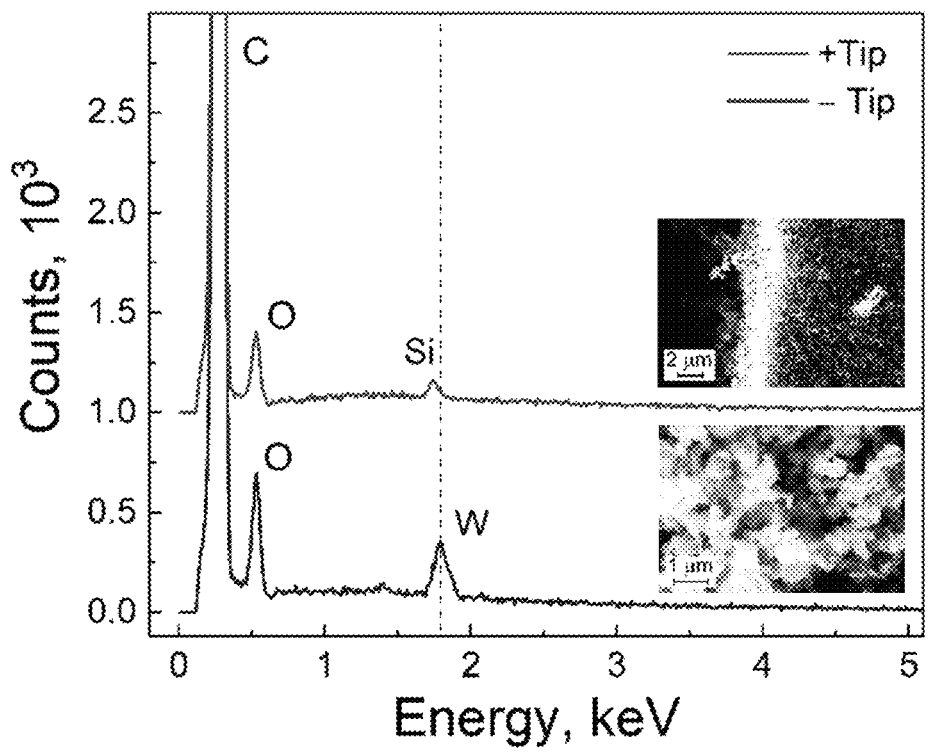
FIG. 6B is a graph showing EDAX spectra of debris along the cut edges for positive (red line) and negative (blue line) polarity of the tungsten tip. Insets show SEM images of sampled areas, respectively.

FIGS. 5A, 5B show typical edges on a 52 μm wide trench created by STEM patterning of a 200-μm-tall MWNT forest. The obtained width of the trench is mostly determined by the diameter of the conical tungsten tip at the inserted level. The inner walls of the trench are clean all the way from the top edges to the trench bottom. The Raman spectra of the inner walls and the short debris on the trench edges are the same as for a pristine forest (see FIG. 6). For comparison, using the same MWNT forest, this actual example used laser patterning by a 30-μm-diameter focused beam. The laser beam created a wide (~300 μm) conical trench and a heat-affected zone (HAZ) that extends to ~200 μm in both sides of the trench. Note, the HAZ region for a laser cut is not drawable, while the STEM patterning creates a very narrow kerf and a narrow HAZ that enables drawability (see FIG. 5B and figures S7.2, and S7.10 of the Supplementary Material of U.S. Ser. No. 63/048,037).

The polarity of tungsten tip is crucial for obtaining clean, high precision cutting. For a positive tungsten tip, small sharp pulses were observed at ~10 V. Visible light emission can be seen under an optical microscope (FIG. S1) when the tip touches the forest. However, dense bundles create insurmountable obstacles for the moving tip, by shorting the electron emission discharge. Upon further increase of the applied voltage, short pulses dominate. The continuous cut of a MWNT forest (using an ohmically connected cathode), with full penetration of the tungsten tip into the forest, starts at the same voltages as for MWNT sheets (~25-30 V). In the voltage region of 30-50 V, continuous cutting was accompanied by the formation of a dendrite wedge on the on the front end of moving tip. These wedge-shaped dendritic structures penetrate through the forest structure and widen the trench after several centimeters of tip travel. Above 50 V (50-58 V) this dendrite structure is automatically destroyed by random ignition of plasma-like sparks, which create small craters on the trench edges (see FIG. 5B for +50 V and +55 V trenches). In this regime, the speed of electro-discharge cutting can be as high as allowed by the present XY translation stage (~1 cm/s). At voltages above 60 V, the intensity of plasma-like sparks increases, creating large 100-200 μm-diameter craters, which makes the patterning uncontrollable. Because of these problems, using a positive tungsten tip to obtain a well-defined, sharp edge for a high MWNT forest requires tip cleaning after about a centimeter of travel. This cleaning was obtained by removing the tip from the forest and then burning the residue from the tip using a plasma-generating high-voltage pulse. For convenient application, this tip cleaning process could be automated.

For a negative polarity tungsten tip in a high MWNT forest, the carbon debris is automatically rejected from the trench, and is observed on the top of the forest (near the cut) and not on the walls of the cut (see FIG. 5B) for −55 V and figures in sections S8 and S10 of the Supplementary Material of U.S. Ser. No. 63/048,037. No dendrites formed for a negative tip polarity. FIG. 5B shows that STEM patterning is particularly useful for cutting parallel trenches that enable the drawing of narrow sheets from a high CNT forest. The narrowest patterned MWNT forest strip that is drawable, with minimal losses, is 20 μm wide (see figures in sections S8-11 of the Supplementary Material of U.S. Ser. No. 63/048,037).

The Raman spectra (FIG. 6A) for the forest surface show that the debris near the cut edges (for both tip polarities) comprises principally CNT segments. The elevated saddle-point between D and G peaks for dendrites (topmost green line), resulting from an increased D' peak (~1550 cm⁻), indicates the dominance of amorphous carbon in the debris. Energy dispersive X-ray analysis (EDAX) spectra shown in FIG. 6B confirms the principally carbon content of patterned edges and debris for a positive tungsten tip (>99.9%), while for a negative tip, small traces of tungsten were observed in the debris. The erosion of the tungsten tip surface observed in electron microscope images for the negative polarity tip confirms the origin of the W peak in the EDAX spectra. Partial oxidation of carbon nanotubes at such high spark temperatures gives some small traces of oxygen for both polarities. However, oxidation dominates for negative polarity of tip, which reflects the broader heat-effected zone.

Figure 7A:
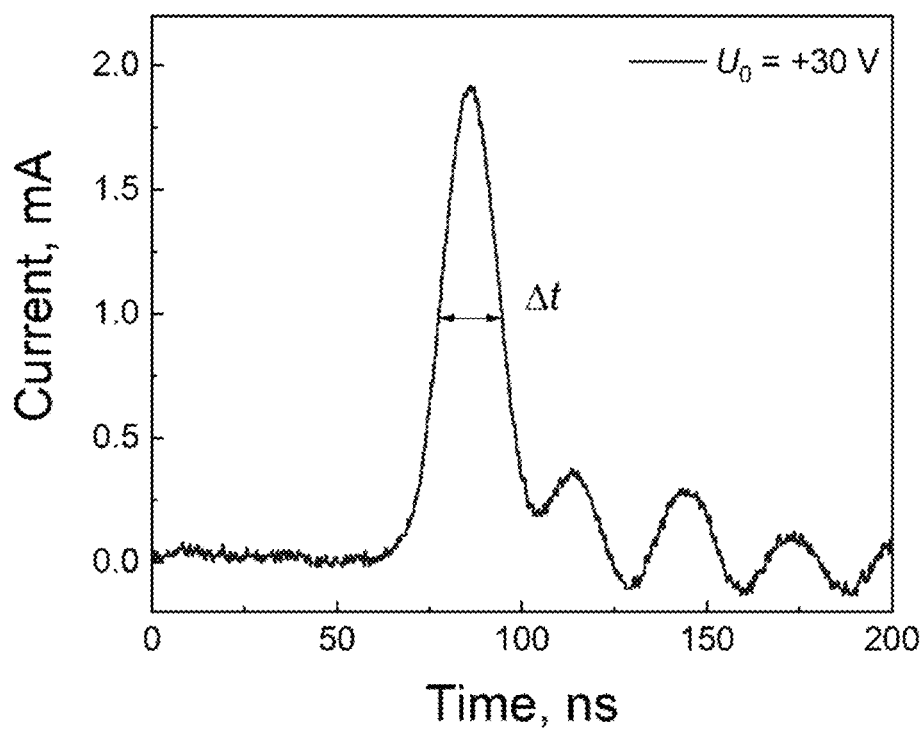
FIGS. 7A-7B are snapshots of oscilloscope images recorded using a TCP0030A current probe.
Figure 7B:
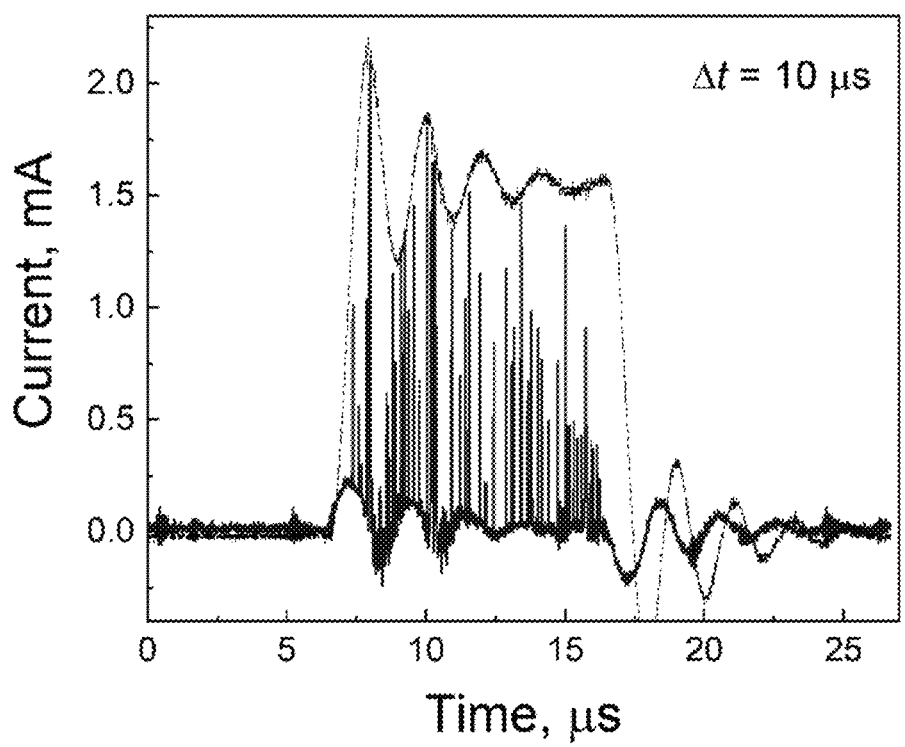

The self-terminating-current circuit used for STEM patterning transforms the applied DC voltage into a dense sequence of short current pulses. However, periodic modulation of the DC voltage is preferred for reducing the average resistively generated thermal energy. The use of external short pulses, instead of a DC voltage, provides time for heat dissipation after each applied pulse, thereby reducing the HAZ. FIG. 7B shows that a chain of narrow current pulses results from each 10 μs wide applied voltage pulse. These short self-terminated current pulses are well resolved, and the duration of each individual spark pulse does not exceed 20 ns (see FIG. 7A).

The chopping of the applied DC voltage with appropriate duty cycle provides a lower average temperature for the area surrounding the tip. In addition, the parallel-connected RC circuit was adjusted to provide low impedance for short pulses ($\tau=RC=10$ ns, where $R=1$ kΩ, $C=1$ nF), thereby protecting the sample from undesirable shorting and limiting spark currents. The smallest average kerf width for a free-standing MWNT sheets (using an electrochemically sharpened tungsten tip with a tip diameter of ~160 nm and the above optimal conditions ($U_p=30$ V, $f_p=1000$ Hz, $dt=10$ μs)), was ~200±40 nm, which is mostly determined by the diameter of the tip and the electron emission distance.

Assuming that the degradation of carbon nanotubes is caused by thermal dissociation of C—C bonds under a strong electron emission current, and that the main heat dissipative mechanism of the applied power, $P_h$, is a thermal conduction along the CNTs ($\kappa=600$ W/m·K), the temperature increase, $T_a$, can be estimated from the power balance equation, $T_a = P_h/(2Sk(\pi f/\alpha)^{1/2})$. Neglect the heat capacitance of carbon nanotubes (it is lower than heat capacitance of surrounding air), and assume that the thermal diffusion length, $L_{DC}=\pi(\alpha \cdot \tau)^{1/2}=67$ μm per 10 μs, is much longer than the length of the average carbon segments observed on the cut edges (~200 nm). During a short spark pulse of 20 ns, applied to 200-nm-long single MWNT (or bundle of 5 MWNTs), the temperature could exceed ~$1.4 \cdot 10^6$ K for a single MWNT and ~$0.625 \times 10^6$ K for CNT bundles. Use for the applied power, $P_h=I^2R=1 \cdot 10^{-2}$ W, (R=50 kΩ/μm, I=1 mA). $S=F \cdot \pi r^2 = 54 \cdot 10^{-18}$ m² (~$2.7 \cdot 10^{-16}$ m²) is the surface area of single MWNT (cross-section of 5 nanotubes in bundle), F=0.68 is the filling factor, and $\alpha=$~540 mm²/s is the thermal diffusivity of close-packed MWNTs with an average density of 1540 kg/m³. The obtained temperature substantially exceeds the sublimation temperature of graphitic carbon structures (~3915 K). The numerical estimation of blackbody radiation and surrounding air contributions slightly decrease the obtained temperature. The decomposition of carbon nanotubes, which is visible as a burst of light, starts from a localized region and then expands. The high-density current in a single CNT also overheats the nearest inter-nanotube connection in the CNT network. The abundance of elongated carbon particles and short carbon nanotube segments along the cut edges supports this assumption.

Figures 8A, 8B, 8C, 8D, 8E, 8F:
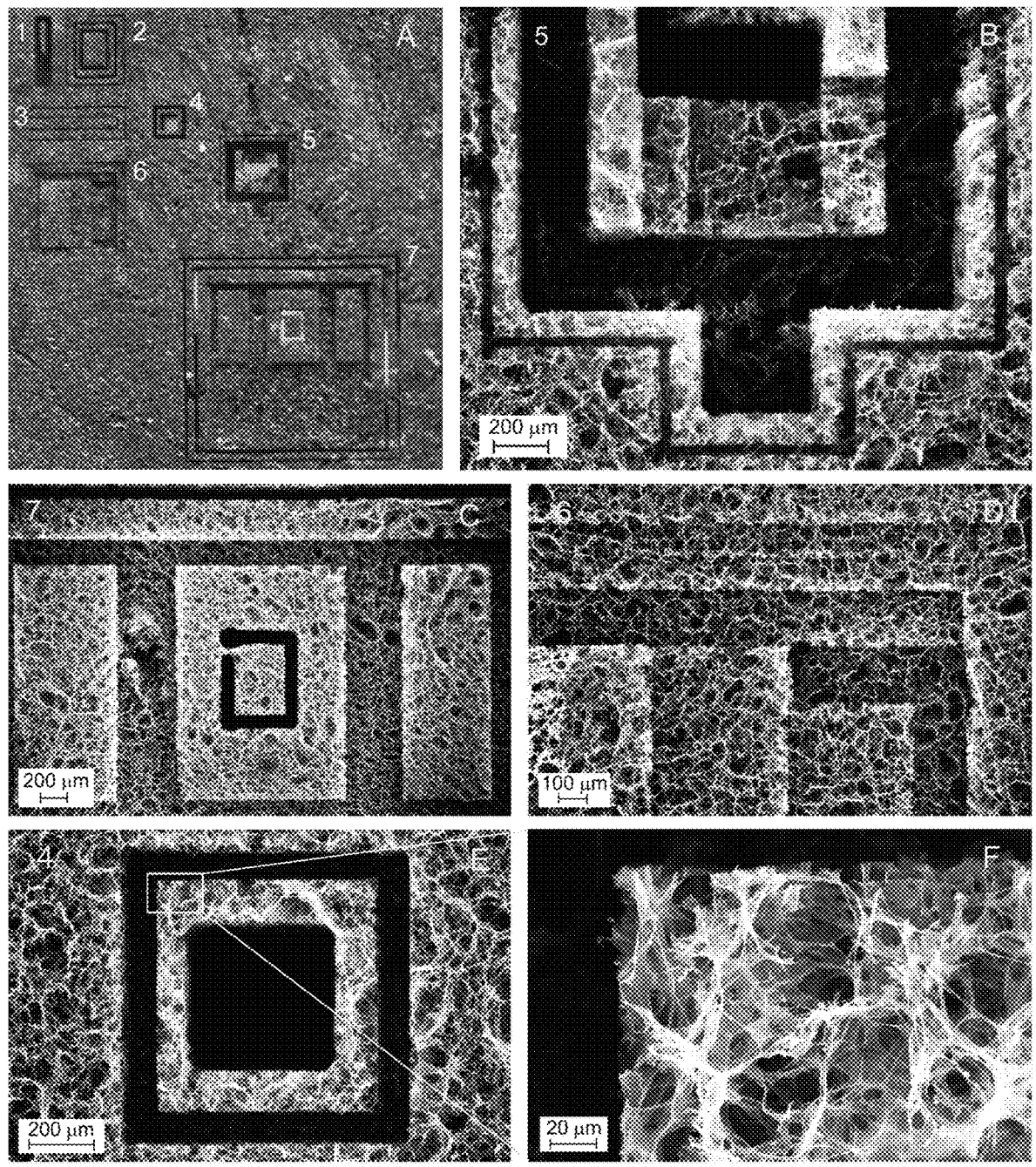
FIGS. 8A-8F show the digital camera (FIG. 8A) and SEM (FIGS. 8B-F) images of patterned graphene sponge. The numbers on SEM images correspond to 3D patterned structures in digital microscope image of FIG. 8A.

FIGS. 8A-8F show typical examples of multilevel 3D patterning in a 1-mm-thick slice of a graphene sponge (GS). This essentially isotropic 3D cross-linked GS, which was fabricated by solvothermal reaction in alcohol, has air-like density and can be reversibly compressed to giant strains. The large pores in the sponge (with diameters exceeding ~50 μm) does not permit demonstration of the nanoscale precision of STEM patterning. Nevertheless, the deviation of edges from a straight line (<1 μm) and the sharpness of corners provides insight into the precision of the cut. Especially interesting, the 20-μm-wide bridge of structure 7 fully supports a 0.3×0.4×1 mm isolated sponge segment and connects it with a surrounding patterned sponge region (see FIG. 8C). FIG. 8F shows that the intrinsic structure of the GS is preserved even on the walls formed by cutting. The details of graphene sponge patterning are presented in S11 of the Supplementary Material of U.S. Ser. No. 63/048,037.

Figures 9A, 9B:
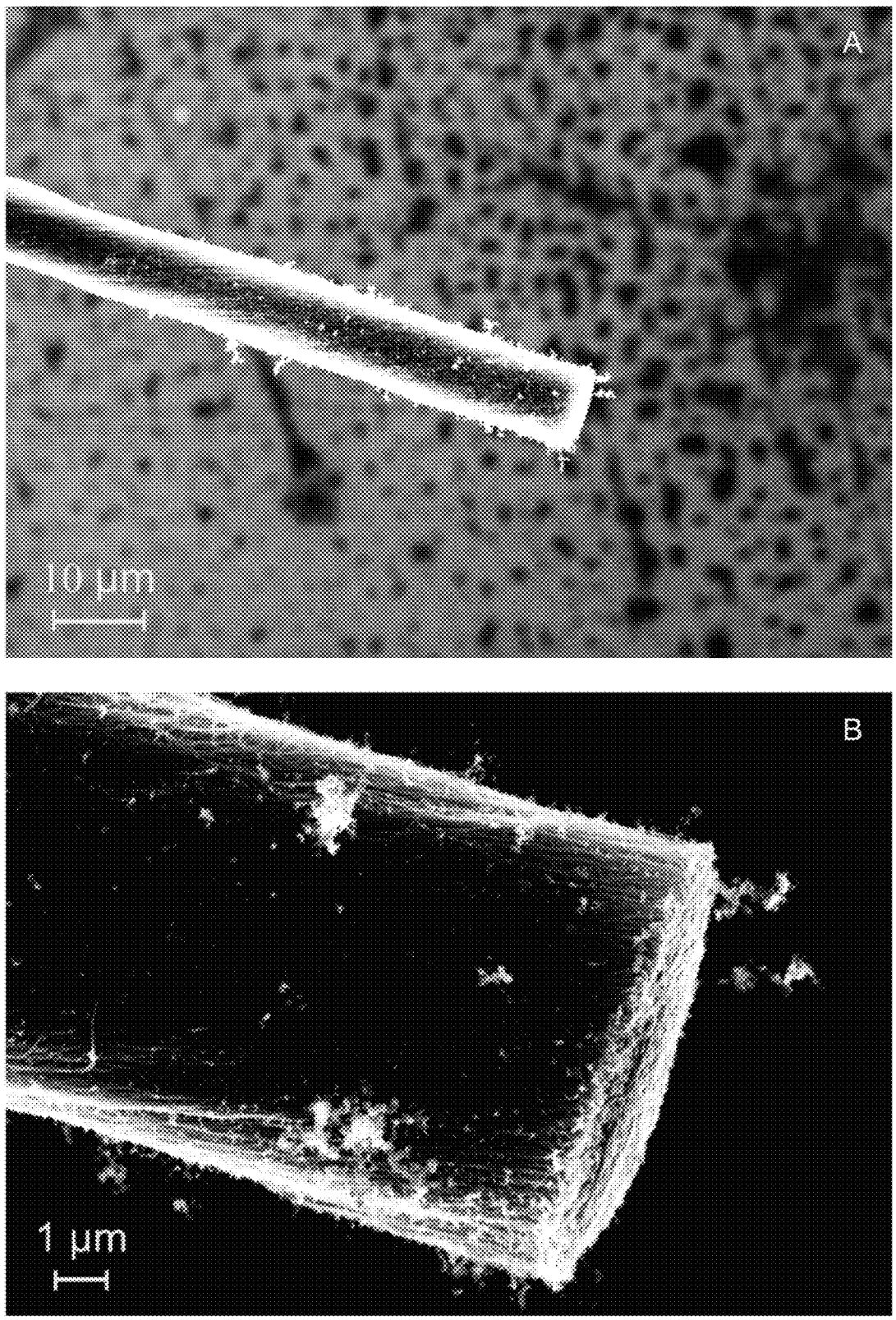
FIGS. 9A-9B show STEM patterning in MWNT yarns. Low (FIG. 9A) and high magnification (FIG. 9B) SEM images of a 9-µm-diameter MWNT yarn cut using STEM patterning.

FIGS. 9A, B show a 9.0-μm-diameter MWNT yarn that was sectioned using the STEM technology. The MWNT yarn was twist-spun from a 5-mm-wide strip that was drawn from a 200-μm-tall MWNT forest, densified in methanol, and dried at 120° C. for 30 min. A +30 V DC voltage was applied to the commercial W-tip to cut the suspended MWNT yarn. The densified MWNT yarn is too dense (1.0-1.2 g/cm$^3$) a structure for fully advanced field-enhanced, electron-emission-based STEM patterning, which limited the sharpness of the cut. More specifically, the structure of debris around the cut (10-20 nm nanospheres) and the shape and amplitude of current pulses suggest that field enhancement is relatively low, and cutting mainly occurs by resistive contact decomposition. Although the cut-edge is rough, compared to focused ion beam (FIB) micromachining, the cutting time is four orders faster, i.e. a fraction of second. Moreover, the cut edge is not contaminated with foreign material, which is not the case for gallium-ion-based FIB cutting.

Various combinations of electro-discharge patterning parameters were used for optimizing the process for 2-D and 3-D structure formation. TABLE I summarizes the optimal parameters found for studied nanostructures.

TABLE 1

| Parameter | MWNT sheet | MWNT forest | MWNT yarn | Graphene film (1 μm) | Graphene sponge | MXene film |
|---|---|---|---|---|---|---|
| Applied voltage, V | 30-35 | 55 | 30-35 | 40 | 40 | 35-40 |
| Pulse duration, μs | 2 | 10 | 10 | 10 | 2 | 10 |
| Pulse frequency, Hz | 10000 | 1000 | 1000 | 1000 | 10000 | 1000 |
| Speed of tip, cm/s | 20 | 10 | 0.01 | 3 | 5 | 1 |

The disclosures of all patents, patent applications, and publications cited herein are hereby incorporated herein by reference in their entirety for all purposes. In particular, information regarding the present inventions is set forth in a published paper co-authored by the inventors, entitled "Shaping nanomaterials by short electrical pulses" (Aliev et al., Jun. 22, 2020 *Nanotechnology* Volume 31, Number 36) is hereby incorporated by reference in its entirety for all purposes.

Simulation of current distribution through the network of a freestanding CNT sheet.

The equivalent circuit simulation of 2D current distribution for two orthogonally superimposed, highly aligned MWNT sheets shows a rapid decrease of current (voltage drop in the circuitry of FIG. 2A) as the distance of a node (i.e., the intersection between CNTs) from the tip increases. For this circuit simulation, CircuitMaker-2000 (MicroCode Engineering, Inc.) software was used. The individual resistors in the pictured rectangular resistor network have an averaged resistance of 1 kΩ, which corresponds to the measured resistance of a 200 nm long bundle of 10 MWNTs (50 kΩ/μm for single MWNT). Using this resistance correctly predicts the chain-direction resistance of a CNT sheet (1 kΩ/sq). The current flow through a node decreases as $2^n$ as the number of nodes (n) located at a given distance from a central node (where the tip is located) increases. FIG. 2B shows that this current decreases one order of magnitude as the distance from the tip increases to 1 μm, and that this current decay occurs essentially isotropically. This distribution of current among increasing number of MWNTs (as well as the increasing surface area corresponding to the increasing n), increases the ability to localize damage by dissipating heat from distant nodes.

The thermal conductivity of high-quality individual CNTs is extremely high, above 3000 W/m·K. However, the network of a thin MWNT aerogel sheet (drawn from a super-aligned forest) has a much lower thermal conductance, due to the low structural quality of individual MWNTs, tube-tube interconnect resistance, bundling, and low density. The thermal conductivity of a single MWNT sheet is ~50 W/m·K, and the thermal diffusivity, ~45 mm$^2$/s. Thus, the hot spot created by DC electrical current can propagate radially at 20 mm per second. For a thermal diffusion length, $L_{DC}=\pi(\alpha \cdot \tau)^{1/2}$ was used, and for the velocity of a thermal wave $v_T=\pi(\alpha/\tau)^{1/2}$, where T is the characteristic thermal time constant and a is the thermal diffusivity. In fact, when the current through a single CNT exceeds ~1 mA, the temperature at the MWNT cap increases to above the sublimation temperature of carbon in 10 ns (due to the low volumetric heat capacity of CNT sheets) and destroys the nanotube cap or closest inter-nanotube junction. This prevents further expansion of the current and overheated area. Hence, a DC current can be used to cut the CNT sheet with an average kerf smaller than 1 μm. However, to ensure a short pulse excitation of nanotubes and prevent accidental DC current, a 1 kHz sequence of pulses (10 μs pulse width) with a duty cycle of 1% was used.

The phrase nanostructured material is intended to mean a physical substance having one or more features that are characterized by one or more dimensions less than 1 micron. The term uniformly is intended to mean unvarying or deviating very little from a given and/or expected value (e.g. within 5% of). The term substantially is intended to mean largely but not necessarily wholly that which is specified (e.g. at least 95%). The term approximately is intended to mean at least close to a given value (e.g., within 5% of). The term generally is intended to mean at least approaching a given state (e.g. at least 90%). The term coupled is intended to mean connected, although not necessarily directly, and not necessarily mechanically. The term proximate, as used herein, is intended to mean close, near adjacent and/or coincident; and includes spatial situations where specified functions and/or results (if any) can be carried out and/or achieved.

Unless otherwise defined, all technical and scientific terms used herein have the same meaning as commonly understood by one of ordinary skill in the art to which this present disclosure belongs. In case of conflict, the present specification, including definitions, will control.

The described embodiments and examples are illustrative only and not intended to be limiting. Although embodiments of the present disclosure can be implemented separately, embodiments of the present disclosure may be integrated into the system(s) with which they are associated. All the embodiments of the present disclosure disclosed herein can be made and used without undue experimentation in light of the disclosure. Embodiments of the present disclosure are not limited by theoretical statements (if any) recited herein. The individual steps of embodiments of the present disclosure need not be performed in the disclosed manner, or combined in the disclosed sequences, but may be performed in any and all manner and/or combined in any and all sequences. The individual components of embodiments of the present disclosure need not be formed in the disclosed shapes, or combined in the disclosed configurations, but could be provided in any and all shapes, and/or combined in any and all configurations. The individual components need not be fabricated from the disclosed materials, but could be fabricated from any and all suitable materials. Homologous replacements may be substituted for the substances described herein. Agents which are chemically related may be substituted for the agents described herein where the same or similar results would be achieved.

Various substitutions, modifications, additions and/or rearrangements of the features of embodiments of the present disclosure may be made without deviating from the scope of the underlying inventive concept. All the disclosed elements and features of each disclosed embodiment can be combined with, or substituted for, the disclosed elements and features of every other disclosed embodiment except where such elements or features are mutually exclusive. The scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" or "mechanism for" or "step for". Sub-generic embodiments of this disclosure are delineated by the appended independent claims and their equivalents. Specific embodiments of this disclosure are differentiated by the appended dependent claims and their equivalents.

What is claimed is:

1. A method of non-contact, dry-state patterning of a conducting nanostructured material, the method comprising:
   applying a positive voltage signal to a probe tip with respect to the conducting nanostructured material;
   moving the probe tip with respect to the conducting nanostructured material while maintaining a spatial separation between the probe tip and the conducting nanostructured material;
   generating electron field emission within the spatial separation with respect to the conducting nanostructured material; and
   removing material from at least a first portion of the nanostructured material,
   wherein the positive voltage signal comprises a periodic sequence of electrical pulses comprising substantially rectangular pulses having a pulse width of between approximately 1 μsec and approximately 10 μsec at a frequency of between approximately 1 kHz and approximately 10 kHz.

2. The method of claim 1, wherein the rectangular pulses have a maximum amplitude of between approximately 25 V and approximately 60 V.

3. The method of claim 1, further comprising removing debris from the probe tip by generating a plasma between the probe tip and a counter electrode.

4. The method of claim 1, further comprising attracting debris from the first portion of the nanostructured material by applying an attracting voltage between the probe tip and an additional electrode located opposite the nanostructured material with regard to the probe tip, wherein the attracting voltage is more positive than the positive voltage signal applied to the probe.

5. The method of claim 1, wherein the periodic sequence of electrical pulses includes a time interval between pulses configured to prevent damage to a second portion of the nanostructured material adjacent to the first portion of the nanostructured material.

6. The method of claim 1, wherein the conducting nanostructured material has a low-density structure that provides a field enhancement factor for electron emission of above 100.

7. The method of claim 1, wherein the probe and conducting nanostructured material are immersed in ambient pressure air.

8. The method of claim 1, wherein the probe and conducting nanostructured material are immersed in at least one gas selected from a noble gas, an $SF_6$ gas, a nitrogen gas, and mixtures thereof.

9. The method of claim 1, wherein the probe and conducting nanostructured material are located in a vacuum.

10. The method of claim 1, wherein the nanostructured material is freestanding.

11. The method of claim 1, wherein the nanostructured material comprises carbon nanotubes, graphene, graphene oxide, a MXene, a chalcogenide, or a combination thereof.

12. An apparatus for non-contact, dry-state patterning of a conducting nanostructured material, the apparatus comprising:
    a power supply configured to provide a positive voltage signal with respect to the conducting nanostructured material; and
    a probe tip coupled to the power supply, the probe tip configured to move with respect to the nanostructured material while maintaining a spatial separation between the probe tip and the conducting nanostructured material, to generate electron field emission within the spatial separation with respect to the conducting nanostructured material, and to remove material from at least a first portion of the conducting nanostructured material,
    wherein the positive voltage signal comprises a periodic sequence of electrical pulses comprising substantially rectangular pulses having a pulse width of between approximately 1 μsec and approximately 10 μsec at a frequency of between approximately 1 kHz and approximately 10 kHz.

13. The apparatus of claim 12, further comprising a probe tip translator coupled to the probe tip, the probe tip translator configured to move the probe tip relative to the conductive nanostructured material in at least one dimension.

14. The apparatus of claim 12, wherein the power supply is configured to provide a constant amplitude voltage between approximately 25 V and approximately 60 V.

15. The apparatus of claim 12, further comprising a counter electrode configured for cleaning the probe tip.

16. The apparatus of claim 15, wherein the counter electrode is configured to generate a plasma between the probe tip and the counter electrode.

17. The apparatus of claim 12, further comprising an additional electrode located opposite the nanostructured material with regard to the probe tip configured to attract debris from the first portion of the nanostructured material by application of an attracting voltage between the probe tip and the additional electrode that is more positive than the positive voltage signal applied to the probe.

18. The apparatus of claim 12, wherein the probe tip comprises Ti, Fe, Ni, Au, Pt, W, or a combination thereof.

19. The apparatus of claim 12, wherein the probe tip is configured for cutting a line in a nanostructured material, the line having a kerf of below 100 nm.

20. The apparatus of claim 12, wherein the probe tip has a curvature radius of not greater than about 0.5 μm.

* * * * *